(12) United States Patent
Yaguchi et al.

(10) Patent No.: US 12,084,592 B2
(45) Date of Patent: Sep. 10, 2024

(54) COATING COMPOSITION FOR PATTERN INVERSION

(71) Applicant: NISSAN CHEMICAL CORPORATION, Tokyo (JP)

(72) Inventors: Hiroaki Yaguchi, Toyama (JP); Makoto Nakajima, Toyama (JP); Yuki Endo, Toyama (JP); Wataru Shibayama, Toyama (JP); Shuhei Shigaki, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 655 days.

(21) Appl. No.: 16/339,489

(22) PCT Filed: Oct. 2, 2017

(86) PCT No.: PCT/JP2017/035827
§ 371 (c)(1),
(2) Date: Apr. 4, 2019

(87) PCT Pub. No.: WO2018/066515
PCT Pub. Date: Apr. 12, 2018

(65) Prior Publication Data
US 2019/0292403 A1    Sep. 26, 2019

(30) Foreign Application Priority Data
Oct. 4, 2016   (JP) .................................. 2016-196747

(51) Int. Cl.
*C09D 183/06*   (2006.01)
*B05D 1/32*   (2006.01)
(Continued)

(52) U.S. Cl.
CPC ............. *C09D 183/06* (2013.01); *B05D 1/32* (2013.01); *B05D 1/36* (2013.01); *B05D 3/10* (2013.01);
(Continued)

(58) Field of Classification Search
CPC ................................ C09D 183/06; G03F 7/40
See application file for complete search history.

(56) References Cited

U.S. PATENT DOCUMENTS

2002/0036183 A1   3/2002  Shibata
2012/0123135 A1*  5/2012  Bradford ........... H01L 21/02282
                                                          264/447
(Continued)

FOREIGN PATENT DOCUMENTS

CN     104271641 A    1/2015
JP     2001-033949 A  2/2001
(Continued)

OTHER PUBLICATIONS

Jan. 9, 2018 International Search Report issued in International Patent Application No. PCT/JP2017/035827.
(Continued)

*Primary Examiner* — Peter L Vajda
*Assistant Examiner* — Jayson D Cosgrove
(74) *Attorney, Agent, or Firm* — Oliff PLC

(57) ABSTRACT

A coating composition for pattern inversion that fills a gap in an organic underlayer film pattern formed on a substrate to be processed by transferring a resist pattern to an underlayer and forms a flat polysiloxane film, the coating composition including a polysiloxane obtained by a reaction of an alcohol with a silanol group in a hydrolysis-condensate of a hydrolysable silane having a hydrolysable silane containing in the molecule four hydrolysable groups, in a ratio of 50% by mole to 100% by mole relative to the total amount of silanes. The hydrolysable silane is represented by Formula (1):

(Continued)

$R^1{}_a Si(R^2)_{4-a}$     Formula (1)

and contains 50% by mole to 100% by mole of a hydrolysable silane in which a is 0 and 0% by mole to 50% by mole of a hydrolysable silane in which a is 1 or 2. The alcohol is propylene glycol monomethyl ether, propylene glycol monoethyl ether, or 3-methoxybutanol.

11 Claims, 1 Drawing Sheet

(51) Int. Cl.
| | |
|---|---|
| *B05D 1/36* | (2006.01) |
| *B05D 3/10* | (2006.01) |
| *B05D 7/00* | (2006.01) |
| *B05D 7/04* | (2006.01) |
| *B05D 7/24* | (2006.01) |
| *C08G 77/38* | (2006.01) |
| *C09D 183/04* | (2006.01) |
| *G03F 7/11* | (2006.01) |
| *G03F 7/16* | (2006.01) |
| *G03F 7/40* | (2006.01) |
| *H01L 21/027* | (2006.01) |

(52) U.S. Cl.
CPC .................. *B05D 7/00* (2013.01); *B05D 7/04* (2013.01); *B05D 7/24* (2013.01); *C08G 77/38* (2013.01); *C09D 183/04* (2013.01); *G03F 7/11* (2013.01); *G03F 7/16* (2013.01); *G03F 7/40* (2013.01); *H01L 21/027* (2013.01)

(56) References Cited

U.S. PATENT DOCUMENTS

| | | | |
|---|---|---|---|
| 2015/0087772 | A1 | 3/2015 | Horstman et al. |
| 2015/0118396 | A1* | 4/2015 | Wakayama .............. C09D 5/00 427/258 |
| 2015/0346601 | A1* | 12/2015 | Wu ........................ G03F 7/0226 430/281.1 |
| 2017/0271151 | A1* | 9/2017 | Yaguchi .................... G03F 7/32 |

FOREIGN PATENT DOCUMENTS

| | | |
|---|---|---|
| JP | 2002-110510 A | 4/2002 |
| JP | 2004-363371 A | 12/2004 |
| JP | 2008-287176 A | 11/2008 |
| JP | 2009-128564 A | 6/2009 |
| JP | 2010-020109 A | 1/2010 |
| JP | 2011-118373 A | 6/2011 |
| JP | 2012-533674 A | 12/2012 |
| JP | 2015-038221 A | 2/2015 |
| WO | 2015/129405 A1 | 9/2015 |
| WO | 2016/031563 A1 | 3/2016 |

OTHER PUBLICATIONS

Jan. 9, 2018 Written Opinion of the International Searching Authority issued in International Patent Application No. PCT/JP2017/035827.

* cited by examiner

[FIG.1]
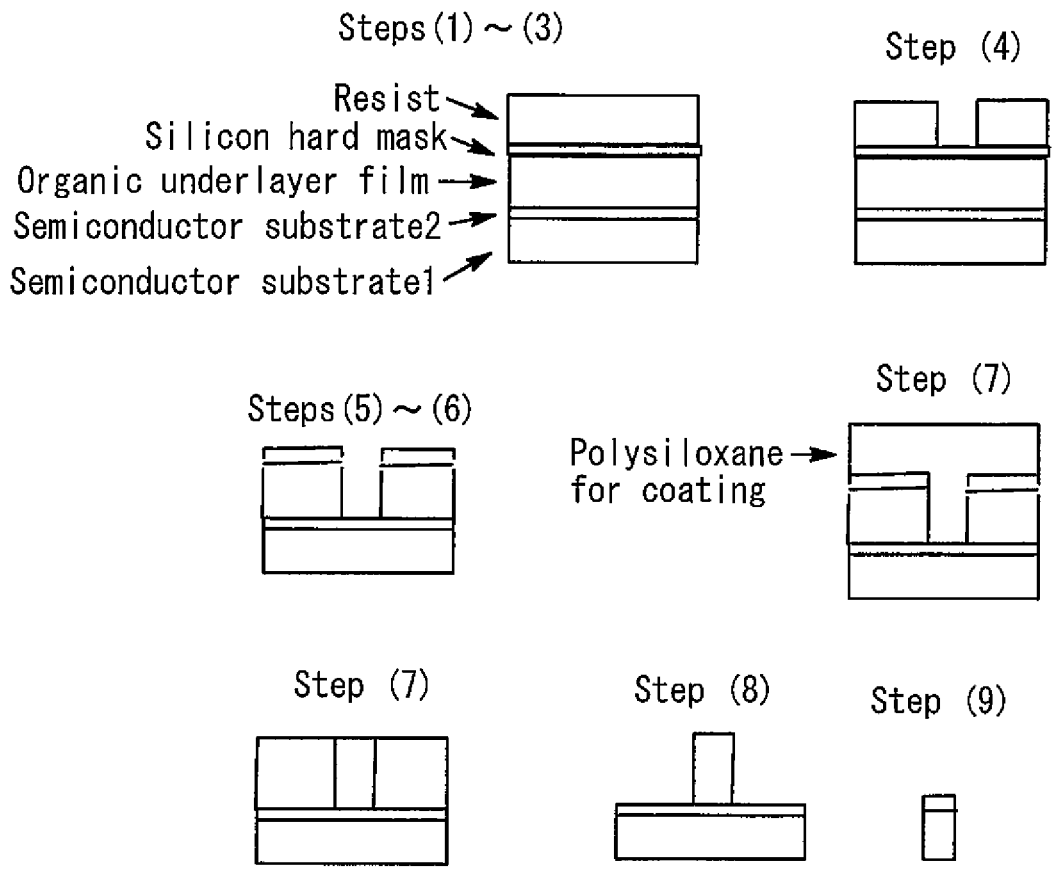
[FIG.2]
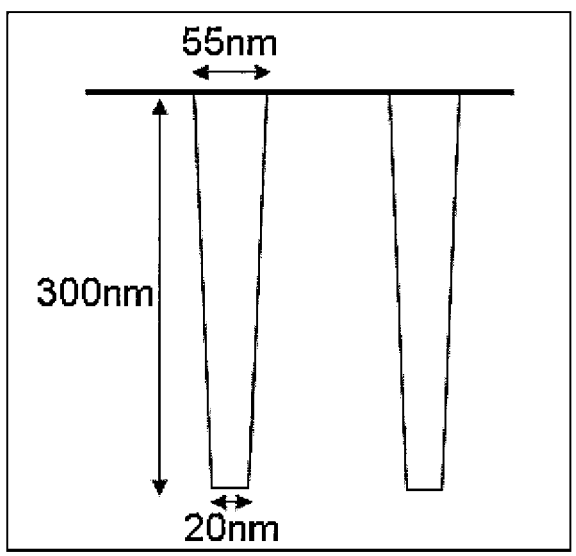

COATING COMPOSITION FOR PATTERN INVERSION

TECHNICAL FIELD

The present invention relates to a coating composition for pattern inversion that is involved in producing electronic devices and is used for forming fine patterns.

BACKGROUND ART

In production of a semiconductor device, microprocessing has been conventionally carried out through lithography using a photoresist composition. The microprocessing is a processing method in which a thin film is formed from the photoresist composition on a substrate to be processed such as a silicon wafer, irradiated with active light such as ultraviolet light through a mask pattern including a pattern of the semiconductor device, and developed to obtain a photoresist pattern, and the substrate to be processed such as a silicon wafer is etched using the photoresist pattern as a protective film. In recent years, an increase in degree of integration of semiconductor devices has advanced. As active light, an ArF excimer laser (193 nm) is used instead of a KrF excimer laser (248 nm), and the wavelength of active light tends to be decreased. This tendency affects diffuse reflection of active light from a substrate and standing wave, which are severe problems. Therefore, a method for providing an anti-reflective coating between a photoresist and a substrate to be processed has been widely considered. For example, a photosensitive resist underlayer film-forming composition containing a polymer having an acrylamide structure has been disclosed (see Patent Document 1).

A resist underlayer film-forming composition containing a polymer having a unit structure of hydroxyacrylamide has been disclosed (see Patent Document 2).

An anti-reflective coating-forming composition containing a polymer having a unit structure of hydroxyalkylene methacrylamide and a unit structure of aromatic alkylene methacrylate has been disclosed (see Patent Document 3).

When a resist pattern is made further finer, problems about resolution and collapse of the resist pattern after development are caused. Thus, a decrease in film thickness of a resist is desired. However, it is difficult to obtain a resist pattern having a film thickness sufficient for substrate processing. Further, a process for imparting a function of a mask to not only the resist pattern but also a resist underlayer film to be formed between a resist and a semiconductor substrate to be processed during substrate processing is required. As a resist underlayer film for such a process, unlike a conventional resist underlayer film having high etching rate (in which the etching rate is high), a resist underlayer film for lithography having a selection ratio of dry etching rate close to that of a resist, a resist underlayer film for lithography having a lower selection ratio of dry etching rate than that of a resist, and a resist underlayer film for lithography having a lower selection ratio of dry etching rate than that of a semiconductor substrate are required.

Along with formation of further finer pattern, a patterning process for inverting a pattern has been disclosed (see Patent Documents 4 and 5).

PRIOR ART DOCUMENTS

Patent Documents

Patent Document 1: Japanese Patent Application Publication No. 2008-287176 (JP 2008-287176 A)

Patent Document 2: Japanese Patent Application Publication No. 2002-110510 (JP 2002-110510 A)

Patent Document 3: Japanese Patent Application Publication No. 2004-363371 (JP 2004-363371 A)

Patent Document 4: Japanese Patent Application Publication No. 2011-118373 (JP 2011-118373 A)

Patent Document 5: International publication No. WO 2015/129405

SUMMARY OF THE INVENTION

Problem to be Solved by the Invention

The present invention provides a coating composition for pattern inversion that fills a gap in an organic underlayer film pattern that is formed on a substrate to be processed by transferring a resist pattern to an underlayer and forms a flat polysiloxane film.

Means for Solving the Problems

A first aspect of the present invention is a coating composition for coating an organic underlayer film pattern formed by transferring a resist pattern to an underlayer, the coating composition comprising a polysiloxane obtained by a reaction of an alcohol with a silanol group in a hydrolysis-condensate of a hydrolysable silane having a hydrolysable silane containing in the molecule four hydrolysable groups, in a ratio of 50% by mole to 100% by mole relative to the total amount of silanes.

A second aspect of the present invention is the coating composition according to the first aspect, wherein the hydrolysable silane having the hydrolysable silane containing in the molecule four hydrolysable groups, in a ratio of 50% by mole to 100% by mole, is represented by Formula (1):

$$R^1_a Si(R^2)_{4-a} \quad \text{Formula (1)}$$

(wherein $R^1$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, or a cyano group and bonded to a silicon atom through a Si—C bond, $R^2$ is an alkoxy group, an acyloxy group, or a halogen atom, and a is an integer of 0 to 3), and contains 50% by mole to 100% by mole of a hydrolysable silane in which a is 0 and 0% by mole to 50% by mole of a hydrolysable silane in which a is 1 or 2.

A third aspect of the present invention is the coating composition according to the second aspect, wherein the hydrolysable silane of Formula (1) contains any of tetraalkoxysilane in which a in Formula (1) is 0, methyltrialkoxysilane in which a in Formula (1) is 1, vinyltrialkoxysilane, phenyltrialkoxysilane, or dimethyldialkoxysilane in which a in Formula (1) is 2.

A forth aspect of the present invention is the coating composition according to any one of the first to third aspects, wherein the alcohol is an alkoxy group-containing alcohol.

A fifth aspect of the present invention is the coating composition according to any one of the first to fourth aspects, wherein the alcohol is propylene glycol monomethyl ether, propylene glycol monoethyl ether, or 3-methoxybutanol.

A sixth aspect of the present invention is the coating composition according to any one of the first to fifth aspects, wherein the hydrolysis-condensate of the hydrolysable silane is obtained by using an acid or base as a catalyst.

A seventh aspect of the present invention is the coating composition according to any one of the first to sixth aspects, comprising an acid and one or more selected from the group consisting of curing catalysts.

An eighth aspect of the present invention is the coating composition according to any one of the first to seventh aspects, wherein the coating composition is used for coating a patterned organic underlayer film, the patterned organic underlayer film is formed by etching a silicon hard mask layer through the resist pattern and etching the organic underlayer film through the patterned silicon hard mask layer.

A ninth aspect of the present invention is a method for producing a semiconductor device comprising steps of: (1) forming an organic underlayer film on a semiconductor substrate; (2) applying a silicon hard mask-forming composition to the organic underlayer film and baking the silicon hard mask-forming composition to form a silicon hard mask layer; (3) applying a resist composition to the silicon hard mask layer to form a resist layer; (4) exposing the resist film, and then developing the resist to obtain a resist pattern; (5) etching the silicon hard mask layer through the resist pattern; (6) etching the organic underlayer film through the patterned silicon hard mask layer to form a patterned organic underlayer film; (7) applying the coating composition according to any one of the first to eighth aspects to the patterned organic underlayer film and curing the coating composition to form a polysiloxane film filling a gap in the pattern; (8) etching the organic underlayer film to obtain an inverted pattern; and (9) etching the substrate through the polysiloxane film having the inverted pattern.

Effects of the Invention

When the patterned organic underlayer film formed on the substrate to be processed by transferring the resist pattern to the underlayer is coated with the polysiloxane-containing coating composition of the present invention, the polysiloxane-containing coating composition can fill a gap in the organic underlayer film pattern without mixing the patterned organic underlayer film.

The present invention is useful as a coating composition with which the organic underlayer film pattern formed by transferring the resist pattern to the underlayer is coated.

The polysiloxane-containing coating composition can be cured to form a polysiloxane, and then subjected to an etch back process (gas etching) to expose a surface of the organic underlayer film. The organic underlayer film can be removed by etching, and thus the organic underlayer film pattern can be inverted to obtain a pattern of the polysiloxane which is filled with the polysiloxane-containing coating composition. The inverted pattern can be used to process the substrate to be processed.

When the adhesion between the substrate to be processed as a subject and the film of the polysiloxane-containing coating composition as a film coating the substrate is higher than the adhesion between the substrate to be processed and the organic underlayer film, the substrate to be processed can be processed through pattern inversion using such a film having higher adhesion.

A conventional technique is a process in which a gap in a photoresist pattern is filled with a polysiloxane-based composition and inverted to a pattern of the polysiloxane by etching with an oxygen-based gas. In the process, the film thickness of the resist is small, and thus an inverted pattern having high aspect ratio is not obtained.

In the present invention, pattern inversion of the organic underlayer film right on the substrate to be processed is carried out using the organic underlayer film pattern having higher aspect ratio than that of the photoresist pattern, and thus an inverted pattern having high aspect ratio is obtained. In the present invention, the organic underlayer film substrate having high aspect ratio is filled, and thus coating with a specific polysiloxane composition is effective.

In the process for filling the gap in the photoresist pattern with polysiloxane-based composition that is the conventional technique, an organic film is present as an underlayer, and thus a treatment such as ashing is difficult. Therefore, the process is often carried out only through gas etching.

In the present invention, the organic underlayer film pattern right on the substrate to be processed or on an oxide film is inverted by using a polysiloxane-based composition. Therefore, after the polysiloxane-based composition is applied so as to fill the gap and cured and the pattern is inverted through gas etching, a residue can be removed by an ashing treatment.

BRIEF DESCRIPTION OF THE DRAWINGS

FIG. 1 is a view illustrating steps for pattern inversion.
FIG. 2 is a cross-sectional view of a stepped substrate that is formed from $SiO_2$ and is coated with a polysiloxane-containing coating composition for evaluation of coating performance.

MODES FOR CARRYING OUT THE INVENTION

The present invention is a coating composition for coating an organic underlayer film pattern formed by transferring a resist pattern to an underlayer. The coating composition contains a polysiloxane obtained by a reaction of an alcohol with a silanol group in a hydrolysis-condensate of a hydrolysable silane having a hydrolysable silane containing in the molecule four hydrolysable groups, in a ratio of 50% by mole to 100% by mole relative to the total amount of silanes.

A silanol group of the polysiloxane obtained by a reaction of an alcohol with a silanol group in the hydrolysis-condensate of the hydrolysable silane is subjected to a dehydration reaction with an alcohol to form an alkoxy group derived from an organic component of the reacted alcohol. Thus, the silanol group is capped. An alcohol to be produced by hydrolysis from the hydrolysis-condensate is removed out of a reaction system, and thus the reacted alcohol is an alcohol that is different from the alcohol to be produced by hydrolysis and is separately added.

The coating composition is useful as a coating composition for coating an organic underlayer film pattern formed by transferring a resist pattern to an underlayer.

The coating composition contains 50% by mole to 100% by mole of the hydrolysable silane of Formula (1) wherein a is 0 and 0% by mole to 50% by mole of the hydrolysable silane of Formula (1) wherein a is 1 or 2, or 60% by mole to 100% by mole of the hydrolysable silane of Formula (1) wherein a is 0 and 0% by mole to 40% by mole of the hydrolysable silane of Formula (1) wherein a is 1 or 2.

In Formula (1), $R^1$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, or a cyano group and bonded to a silicon atom through a Si—C bond, $R^2$ is an alkoxy group, an acyloxy group, or a halogen atom, and a is an integer of 0 to 3.

The polysiloxane-containing coating composition of the present invention contains a hydrolysis-condensate of the hydrolysable silane of Formula (1) and a solvent. The coating composition may further contain, as optional components, an acid, an alcohol, a curing catalyst, an acid generator, an additional organic polymer, a light-absorbing compound, a surfactant, and the like.

The solid content of the polysiloxane-containing coating composition of the present invention is, for example, 0.1% by mass to 50% by mass, 0.1% by mass to 30% by mass, or 0.1% by mass to 25% by mass. Here, the solid content means the content of all the components of the polysiloxane-containing coating composition except for a solvent component.

The ratio of the hydrolysable silane, a hydrolysate thereof, and a hydrolysis-condensate thereof in the solid content is 20% by mass or more, for example, 50% by mass to 100% by mass, 60% by mass to 99% by mass, or 70% by mass to 99% by mass.

As to the hydrolysable silane, hydrolysate thereof, and hydrolysis-condensate thereof, a mixture of the hydrolysable silane, hydrolysate thereof, and hydrolysis-condensate thereof may be used. A condensate obtained by hydrolyzing the hydrolysable silane and condensing the obtained hydrolysate may be used. A mixture of the hydrolysis-condensate with a partial hydrolysate in which hydrolysis is not completed during formation of the hydrolysis-condensate or a silane compound may be used. The condensate is a polymer having a polysiloxane structure.

The alkyl group is a linear or branched alkyl group having a carbon atom number of 1 to 10, and examples thereof include methyl group, ethyl group, n-propyl group, i-propyl group, n-butyl group, i-butyl group, s-butyl group, t-butyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, and 1-ethyl-2-methyl-n-propyl group.

A cyclic alkyl group may also be used. Examples of a cyclic alkyl group having a carbon atom number of 1 to 10 include cyclopropyl group, cyclobutyl group, 1-methyl-cyclopropyl group, 2-methyl-cyclopropyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

The alkenyl group is a $C_{2-10}$ alkenyl group, and examples thereof include ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-i-propylethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-i-butylethenyl group, 2,2-dimethyl-3-butenyl group, 2,3-dimethyl-1-butenyl group, 2,3-dimethyl-2-butenyl group, 2,3-dimethyl-3-butenyl group, 2-i-propyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-i-propyl-1-propenyl group, 1-i-propyl-2-propenyl group, 1-methyl-2-cyclopentenyl group, 1-methyl-3-cyclopentenyl group, 2-methyl-1-cyclopentenyl group, 2-methyl-2-cyclopentenyl group, 2-methyl-3-cyclopentenyl group, 2-methyl-4-cyclopentenyl group, 2-methyl-5-cyclopentenyl group, 2-methylene-cyclopentyl group, 3-methyl-1-cyclopentenyl group, 3-methyl-2-cyclopentenyl group, 3-methyl-3-cyclopentenyl group, 3-methyl-4-cyclopentenyl group, 3-methyl-5-cyclopentenyl group, 3-methylene-cyclopentyl group, 1-cyclohexenyl group, 2-cyclohexenyl group, and 3-cyclohexenyl group.

Examples of the aryl group include $C_{6-20}$ aryl groups such as phenyl group, o-methylphenyl group, m-methylphenyl group, p-methylphenyl group, o-chlorophenyl group, m-chlorophenyl group, p-chlorophenyl group, o-fluorophenyl group, p-mercaptophenyl group, o-methoxyphenyl group, p-methoxyphenyl group, p-aminophenyl group, p-cyanophenyl group, α-naphthyl group, β-naphthyl group, o-biphenylyl group, m-biphenylyl group, p-biphenylyl group, 1-anthryl group, 2-anthryl group, 9-anthryl group, 1-phenanthryl group, 2-phenanthryl group, 3-phenanthryl group, 4-phenanthryl group, and 9-phenanthryl group.

Examples of the organic group having an epoxy group include glycidoxymethyl, glycidoxyethyl, glycidoxypropyl, glycidoxybutyl, and epoxycyclohexyl.

Examples of the organic group having an acryloyl group include acryloylmethyl, acryloylethyl, and acryloylpropyl.

Examples of the organic group having a methacryloyl group include methacryloylmethyl, methacryloylethyl, and methacryloylpropyl.

Examples of the organic group having a mercapto group include ethylmercapto, butylmercapto, hexylmercapto, and octylmercapto.

Examples of the organic group having a cyano group include cyanoethyl and cyanopropyl.

The $C_{1-20}$ alkoxy group is an alkoxy group having a linear, branched, or cyclic alkyl moiety having a carbon atom number of 1 to 20. Examples thereof include methoxy group, ethoxy group, n-propoxy group, i-propoxy group, n-butoxy group, i-butoxy group, s-butoxy group, t-butoxy group, n-pentyloxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group, 1-ethyl-2-methyl-n-propoxy group, and cyclic alkoxy groups such as cyclopropoxy group, cyclobutoxy group, 1-methyl-cyclopropoxy group, 2-methyl-cyclopropoxy group, cyclopentyloxy group, 1-methyl-cyclobutoxy group, 2-methyl-cyclobutoxy group, 3-methyl-cyclobutoxy group, 1,2-dimethyl-cyclopropoxy group, 2,3-dimethyl-cyclopropoxy group, 1-ethyl-cyclopropoxy group, 2-ethyl-cyclopropoxy group, cyclohexyloxy group, 1-methyl-cyclopentyloxy group, 2-methyl-cyclopentyloxy group, 3-methyl-cyclopentyloxy group, 1-ethyl-cyclobutoxy group, 2-ethyl-cyclobutoxy group, 3-ethyl-cyclobutoxy group, 1,2-dimethyl-cyclobutoxy group, 1,3-dimethyl-cyclobutoxy group, 2,2-dimethyl-cyclobutoxy group, 2,3-dimethyl-cyclobutoxy group, 2,4-dimethyl-cyclobutoxy group, 3,3-dimethyl-cyclobutoxy group, 1-n-propyl-cyclopropoxy group, 2-n-propyl-cyclopropoxy group, 1-i-propyl-cyclopropoxy group, 2-i-propyl-cyclopropoxy group, 1,2,2-trimethyl-cyclopropoxy group, 1,2,3-trimethyl-cyclopropoxy group, 2,2,3-trimethyl-cyclopropoxy group, 1-ethyl-2-methyl-cyclopropoxy group, 2-ethyl-1-methyl-cyclopropoxy group, 2-ethyl-2-methyl-cyclopropoxy group, and 2-ethyl-3-methyl-cyclopropoxy group.

Examples of the $C_{2-20}$ acyloxy group include methylcarbonyloxy group, ethylcarbonyloxy group, n-propylcarbonyloxy group, i-propylcarbonyloxy group, n-butylcarbonyloxy group, i-butylcarbonyloxy group, s-butylcarbonyloxy group, t-butylcarbonyloxy group, n-pentylcarbonyloxy group, 1-methyl-n-butylcarbonyloxy group, 2-methyl-n-butylcarbonyloxy group, 3-methyl-n-butylcarbonyloxy group, 1,1-dimethyl-n-propylcarbonyloxy group, 1,2-dimethyl-n-propylcarbonyloxy group, 2,2-dimethyl-n-propylcarbonyloxy group, 1-ethyl-n-propylcarbonyloxy group, n-hexylcarbonyloxy group, 1-methyl-n-pentylcarbonyloxy group, 2-methyl-n-pentylcarbonyloxy group, 3-methyl-n-pentylcarbonyloxy group, 4-methyl-n-pentylcarbonyloxy group, 1,1-dimethyl-n-butylcarbonyloxy group, 1,2-dimethyl-n-butylcarbonyloxy group, 1,3-dimethyl-n-butylcarbonyloxy group, 2,2-dimethyl-n-butylcarbonyloxy group, 2,3-dimethyl-n-butylcarbonyloxy group, 3,3-dimethyl-n-butylcarbonyloxy group, 1-ethyl-n-butylcarbonyloxy group, 2-ethyl-n-butylcarbonyloxy group, 1,1,2-trimethyl-n-propylcarbonyloxy group, 1,2,2-trimethyl-n-propylcarbonyloxy group, 1-ethyl-1-methyl-n-propylcarbonyloxy group, 1-ethyl-2-methyl-n-propylcarbonyloxy group, phenylcarbonyloxy group, and tosylcarbonyloxy group.

Examples of the halogen atom include fluorine, chlorine, bromine, and iodine.

It is preferable that the hydrolysable silane of Formula (1) contain any of tetraalkoxysilane in which a in Formula (1) is 0, methyltrialkoxysilane in which a in Formula (1) is 1, vinyltrialkoxysilane, phenyltrialkoxysilane, or dimethyl-dialkoxysilane in which a in Formula (1) is 2.

A polysiloxane obtained by a reaction of an alcohol with a silanol group in the hydrolysis-condensate of the hydrolysable silane may be used.

Examples of the alcohol include methanol, ethanol, 1-butanol, 2-butanol, isobutyl alcohol, tert-butyl alcohol, 1-pentanol, 2-pentanol, 3-pentanol, 1-heptanol, 2-heptanol, tert-amyl alcohol, neopentyl alcohol, 2-methyl-1-propanol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, 1-butoxy-2-propanol, and cyclohexanol.

The alcohol is particularly preferably an alkoxy group-containing alcohol, and examples thereof include ethylene glycol monomethyl ether, ethylene glycol monoethyl ether, diethylene glycol monomethyl ether, diethylene glycol monoethyl ether, propylene glycol monomethyl ether, and propylene glycol monoethyl ether. In particular, propylene glycol monomethyl ether or propylene glycol monoethyl ether may be preferably used.

In the present invention, a silanol group in the hydrolysis-condensate of the hydrolysable silane can reacted with an alcohol at any ratio. In the polysiloxane to be obtained, the ratio by mole of (silanol group):(silanol group reacted with the alcohol) is 100:1 to 1:100 or 10:1 to 1:10, and typically 0.75:0.15 to 0.55:0.10.

Specific examples of the hydrolysis-condensate used in the present invention (polysiloxane) include as follows.

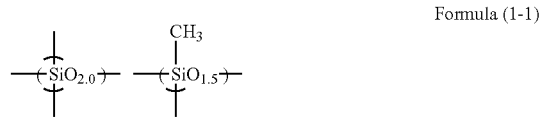

Formula (1-1)

Formula (1-2)

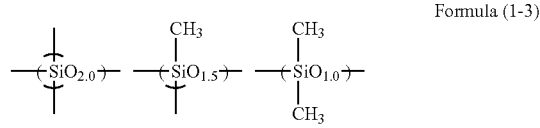

Formula (1-3)

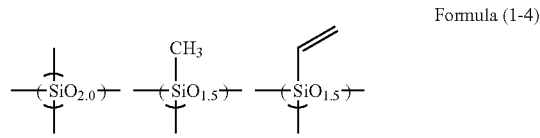

Formula (1-4)

Formula (1-5)

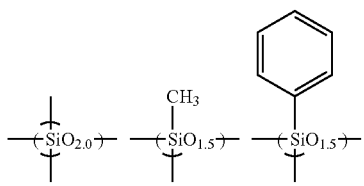

As the hydrolysis-condensate of the hydrolysable silane (polyorganosiloxane), a condensate having a weight average molecular weight of 1,000 to 1,000,000 or 1,000 to 100,000 can be obtained. The molecular weight thereof is a molecular weight determined by gel permeation chromatography (hereinafter abbreviated as GPC) in terms of polystyrene.

The GPC analysis can be performed, for example, by a GPC apparatus (trade name: HLC-8220GPC manufactured by Tosoh Corporation) and a GPC column (trade name: Shodex KF803L, KF802, and KF801 manufactured by Showa Denko K. K.) using tetrahydrofuran as an eluent (elution solvent) and polystyrene (available from Showa Denko K. K.) as a standard sample at a column temperature of 40° C. and a flow rate (flow speed) of 1.0 ml/min.

In hydrolysis of an alkoxysilyl group, an acyloxysilyl group, or a halogenated silyl group, water is used in an amount of 0.5 mol to 100 mol, and preferably 1 mol to 10 mol per mole of a hydrolyzable group.

A hydrolysis catalyst can be used in an amount of 0.001 mol to 10 mol, and preferably 0.001 mol to 1 mol per mole of the hydrolyzable group.

The reaction temperature during the hydrolysis and the condensation is typically 20° C. to 80° C.

The hydrolysis may be complete hydrolysis or partial hydrolysis. In other words, a hydrolysate and a monomer may remain in the hydrolysis-condensate.

During the hydrolysis and the condensation, a catalyst may be used.

As a hydrolysis catalyst, an acid or base may be used.

Examples of the hydrolysis catalyst include a metal chelate compound, an organic acid, an inorganic acid, an organic base, and an inorganic base.

Examples of the metal chelate compound as the hydrolysis catalyst include titanium chelate compounds such as triethoxy-mono(acetylacetonate)titanium, tri-n-propoxy-mono(acetylacetonate)titanium, tri-i-propoxy-mono(acetylacetonate)titanium, tri-n-butoxy-mono(acetylacetonate)titanium, tri-sec-butoxy-mono(acetylacetonate)titanium, tri-t-butoxy-mono(acetylacetonate)titanium, diethoxy-bis(acetylacetonate)titanium, di-n-propoxy-bis(acetylacetonate)titanium, di-i-propoxy-bis(acetylacetonate)titanium, di-n-butoxy-bis(acetylacetonate)titanium, di-sec-butoxy-bis(acetylacetonate)titanium, di-t-butoxy-bis(acetylacetonate)titanium, monoethoxy-tris(acetylacetonate)titanium, mono-n-propoxy-tris(acetylacetonate)titanium, mono-i-propoxy-tris(acetylacetonate)titanium, mono-n-butoxy-tris(acctylacetonate)titanium, mono-sec-butoxy-tris(acetylacetonate)titanium, mono-t-butoxy-tris(acetylacetonate)titanium, tetrakis(acetylacetonate)titanium, triethoxy-mono(ethylacetoacetate)titanium, tri-n-prop oxy-mono(ethylacetoacetate)titanium, tri-i-propoxy-mono(ethylacetoacetate)titanium, tri-n-butoxy-mono(ethylacetoacetate)titanium, tri-sec-butoxy-mono(ethylacetoacetate)titanium, tri-t-butoxy-mono(ethylacetoacetate)titanium, diethoxy-bis(ethylacetoacetate)titanium, di-n-propoxy-bis(ethylacetoacetate)titanium, di-i-propoxy-bis(ethylacetoacetate)titanium, di-n-butoxy-bis(ethylacetoacetate)titanium, di-sec-butoxy-bis(ethylacetoacetate)titanium, di-t-butoxy-bis(ethylacetoacetate)titanium, monoethoxy-tris(ethylacetoacetate)titanium, mono-n-propoxy-tris(ethylacetoacetate)titanium, mono-i-propoxy-tris(ethylacetoacetate)titanium, mono-n-butoxy-tris(ethyl acetoacetate)titanium, mono-sec-butoxy-tris(ethylacetoacetate)titanium, mono-t-butoxy-tris(ethylacetoacetate)titanium, tetrakis(ethylacetoacetate)titanium, mono(acetylacetonate)tris(ethylacetoacetate)titanium, bis(acetylacetonate)bis(ethylacetoacetate)titanium, and tris(acetylacetonate)mono(ethylacetoacetate)titanium; zirconium chelate compounds such as triethoxy-mono(acetylacetonate)zirconium, tri-n-propoxy-mono(acetylacetonate)zirconium, tri-i-propoxy-mono(acetylacetonate)zirconium, tri-n-butoxy-mono(acetylacetonate)zirconium, tri-sec-butoxy-mono(acetylacetonate)zirconium, tri-t-butoxy-mono(acetylacetonate)zirconium, diethoxy-bis(acetylacetonate)zirconium, di-n-propoxy-bis(acetylacetonate)zirconium, di-i-propoxy-bis(acetylacetonate)zirconium, di-n-butoxy-bis(acetylacetonate)zirconium, di-sec-butoxy-bis(acetylacetonate)zirconium, di-t-butoxy-bis(acetylacetonate)zirconium, monoethoxy-tris(acetylacetonate)zirconium, mono-n-propoxy-tris(acetylacetonate)zirconium, mono-i-propoxy-tris(acetylacetonate)zirconium, mono-n-butoxy-tris(acetylacetonate)zirconium, mono-sec-butoxy-tris(acetylacetonate)zirconium, mono-t-butoxy-tris(acetylacetonate)zirconium, tetrakis(acetylacetonate)zirconium, triethoxy-mono(ethylacetoacetate)zirconium, tri-n-propoxy-mono(ethylacetoacetate)zirconium, tri-i-propoxy-mono(ethylacetoacetate)zirconium, tri-n-butoxy-mono(ethylacetoacetate)zirconium, tri-sec-butoxy-mono(ethylacetoacetate)zirconium, tri-t-butoxy-mono(ethylacetoacetate)zirconium, diethoxy-bis(ethylacetoacetate)zirconium, di-n-propoxy-bis(ethylacetoacetate)zirconium, di-i-propoxy-bis(ethylacetoacetate)zirconium, di-n-butoxy-bis(ethylacetoacetate)zirconium, di-sec-butoxy-bis(ethylacetoacetate)zirconium, di-t-butoxy-bis(ethylacetoacetate)zirconium, monoethoxy-tris(ethylacetoacetate)zirconium, mono-n-propoxy-tris(ethylacetoacetate)zirconium, mono-i-propoxy-tris(ethylacetoacetate)zirconium, mono-n-butoxy-tris(ethylacetoacetate)zirconium, mono-sec-butoxy-tris(ethylacetoacetate)zirconium, mono-t-butoxy-tris(ethylacetoacetate)zirconium, tetrakis(ethylacetoacetate)zirconium, mono(acetylacetonate)tris(ethylacetoacetate)zirconium, bis(acetylacetonate)bis(ethylacetoacetate)zirconium, and tris(acetylacetonate)mono(ethylacetoacetate)zirconium; and aluminum chelate compounds such as tris(acetylacetonate)aluminum and tris(ethylacetoacetate)aluminum.

Examples of the organic acid as the hydrolysis catalyst include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, mellitic acid, arachidonic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, and tartaric acid.

Examples of the inorganic acid as the hydrolysis catalyst include hydrochloric acid, nitric acid, sulfuric acid, hydrofluoric acid, and phosphoric acid.

Examples of the organic base as the hydrolysis catalyst include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclooctane, diazabicyclononane, diazabicycloundecene, and tetramethylammonium hydroxide. Examples of the inorganic base include ammonia, sodium hydroxide, potassium hydroxide, barium hydroxide, and calcium hydroxide. Among these catalysts, a metal chelate compound, an organic acid, and an inorganic acid are preferable. One type of the catalyst may be used or two or more types thereof may be used together.

Examples of an organic solvent used for the hydrolysis include aliphatic hydrocarbon-based solvents such as n-pentane, i-pentane, n-hexane, i-hexane, n-heptane, i-heptane, 2,2,4-trimethylpentane, n-octane, i-octane, cyclohexane, and methylcyclohexane; aromatic hydrocarbon-based solvents such as benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, n-amylnaphthalene, and trimethylbenzene; monoalcohol-based solvents such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenyl methyl carbinol, diacetone alcohol, and cresol; polyhydric alcohol-based solvents such as ethylene glycol, propylene glycol, 1,3-butylene glycol, pentanediol-2,4,2-methyl pentanediol-2,4, hexanediol-2,5, heptanediol-2,4,2-ethyl hexanediol-1,3, diethylene glycol, dipropylene glycol, triethylene glycol, tripropylene glycol, and glycerol; ketone-based solvents such as acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-i-butyl ketone, trimethyl nonanone, cyclohexanone, methylcyclohexanone, 2,4-pentanedione, acetonylacetone, diacetone alcohol, acetophenone, and fenchone; ether-based solvents such as ethyl ether, i-propyl ether, n-butyl ether, n-hexyl ether, 2-ethylhexyl ether, ethylene oxide, 1,2-propylene oxide, dioxolane, 4-methyl dioxolane, dioxane, dimethyl dioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, propylene glycol monomethyl ether acetate, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyl tetrahydrofuran; ester-based solvents such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents such as dimethyl sulfide, diethyl sulfide, thiophene, tetrahydrothiophene, dimethylsulfoxide, sulfolane, and 1,3-propanesultone. One type of the solvent may be used or two or more types thereof may be used in combination.

In particular, ketone-based solvents such as acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-i-butyl ketone, trimethyl nonanone, cyclohexanone, methylcyclohexanone, 2,4-pentanedione, acetonylacetone, diacetone alcohol, acetophenone, and fenchone are preferable in terms of storage stability of the solution.

The polysiloxane-containing coating composition of the present invention may contain a curing catalyst. The curing catalyst acts as a curing catalyst during heating and curing a coating film containing a polyorganosiloxane obtained from the hydrolysis-condensate.

As the curing catalyst, an ammonium salt, a phosphine, a phosphonium salt, or a sulfonium salt may be used.

Examples of the ammonium salt include a quaternary ammonium salt having a structure of Formula (D-1):

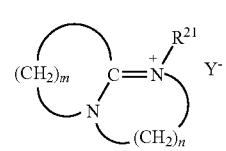

Formula (D-1)

(wherein m is an integer of 2 to 11, n is an integer of 2 or 3, $R^{21}$ is an alkyl group or an aryl group, and $Y^-$ is an anion), a quaternary ammonium salt having a structure of Formula (D-2):

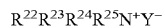

Formula (D-2)

(wherein $R^{22}$, $R^{23}$, $R^{24}$, and $R^{25}$ are an alkyl group or an aryl group, N is a nitrogen atom, $Y^-$ is an anion, and $R^{22}$, $R^{23}$, $R^{24}$, and $R^{25}$ are each bonded to a nitrogen atom through a C—N bond), a quaternary ammonium salt having a structure of Formula (D-3):

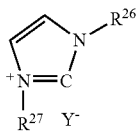

Formula (D-3)

(wherein $R^{26}$ and $R^{27}$ are an alkyl group or an aryl group, and $Y^-$ is an anion), a quaternary ammonium salt having a structure of Formula (D-4):

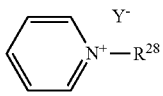

Formula (D-4)

(wherein $R^{28}$ is an alkyl group or an aryl group, and $Y^-$ is an anion), a quaternary ammonium salt having a structure of Formula (D-5):

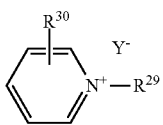

Formula (D-5)

(wherein $R^{29}$ and $R^{30}$ are an alkyl group or an aryl group, and $Y^-$ is an anion), and a tertiary ammonium salt having a structure of Formula (D-6):

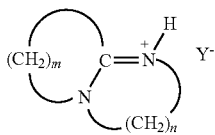

Formula (D-6)

(wherein m is an integer of 2 to 11, n is an integer of 2 or 3, H is a hydrogen atom, and $Y^-$ is an anion).

Examples of the phosphonium salt include a quaternary phosphonium salt of formula (D-7):

$$R^{31}R^{32}R^{33}R^{34}P^+Y^-$$ Formula (D-7)

(wherein $R^{31}$, $R^{32}$, $R^{33}$, and $R^{34}$ are an alkyl group or an aryl group, P is a phosphorus atom, $Y^-$ is an anion, and $R^{31}$, $R^{32}$, $R^{33}$, and $R^{34}$ are each bonded to a phosphorus atom through a C—P bond).

Examples of the sulfonium salt include a tertiary sulfonium salt of Formula (D-8):

$$R^{35}R^{36}R^{37}S^+Y^-$$ Formula (D-8)

(wherein $R^{35}$, $R^{36}$, and $R^{37}$ are an alkyl group or an aryl group, S is a sulfur atom, $Y^-$ is an anion, and $R^{35}$, $R^{36}$, and $R^{37}$ are each bonded to a sulfur atom through a C—S bond).

The compound of Formula (D-1) is a quaternary ammonium salt derived from an amine, wherein m is an integer of 2 to 11, and n is an integer of 2 or 3. $R^{21}$ of the quaternary ammonium salt is a $C_{1-18}$ alkyl or aryl group, and preferably a $C_{2-10}$ alkyl or aryl group. Examples thereof include linear alkyl groups such as ethyl group, propyl group, and butyl group, benzyl group, cyclohexyl group, cyclohexylmethyl group, and dicyclopentadienyl group. Examples of the anion ($Y^-$) include halide ions such as a chloride ion (Cl$^-$), a bromide ion (Br$^-$), and an iodide ion (I$^-$), and acid groups such as carboxylate (—COO$^-$), sulfonate (—SO$_3^-$), and alcoholate (—O$^-$).

The compound of Formula (D-2) is a quaternary ammonium salt of $R^{22}R^{23}R^{24}R^{25}N^+Y^-$. $R^{22}$, $R^{23}$, $R^{24}$, and $R^{25}$ of the quaternary ammonium salt are a $C_{1-18}$ alkyl or aryl group, or a silane compound having a silicon atom bonded through Si—C bond. Examples of the anion ($Y^-$) include halide ions such as a chloride ion (Cl$^-$), a bromide ion (Br$^-$), and an iodide ion (I$^-$), and acid groups such as carboxylate (—COO$^-$), sulfonate (—SO$_3^-$), and alcoholate (—O$^-$). The quaternary ammonium salt is available as a commercial product. Examples thereof include tetramethylammonium acetate, tetrabutylammonium acetate, triethylbenzylammonium chloride, triethylbenzylammonium bromide, trioctylmethylammonium chloride, tributylbenzylammonium chloride, and trimethylbenzylammonium chloride.

The compound of Formula (D-3) is a quaternary ammonium salt derived from 1-substituted imidazole. The number of carbon atoms in $R^{26}$ and $R^{27}$ is 1 to 18, and the total number of carbon atoms in $R^{26}$ and $R^{27}$ is preferably 7 or more. Examples of $R^{26}$ include methyl group, ethyl group, propyl group, phenyl group, and benzyl group. Examples of $R^{27}$ include benzyl group, octyl group, and octadecyl group. Examples of the anion ($Y^-$) include halide ions such as a chloride ion (Cl$^-$), a bromide ion (Br$^-$), and an iodide ion (I$^-$), and acid groups such as carboxylate (—COO$^-$), sulfonate (—SO$_3^-$), and alcoholate (—O$^-$). This compound is available as a commercial product. This compound can also be produced, for example, by a reaction of an imidazole-based compound such as 1-methylimidazole or 1-benzylimidazole with a halogenated alkyl or aryl such as benzyl bromide or methyl bromide.

The compound of Formula (D-4) is a quaternary ammonium salt derived from pyridine. $R^{28}$ is a $C_{1-18}$ alkyl or aryl group, and preferably a $C_{4-18}$ alkyl or aryl group. Examples thereof include butyl group, octyl group, benzyl group, and lauryl group. Examples of the anion ($Y^-$) include halide ions such as a chloride ion (Cl$^-$), a bromide ion (Br$^-$), and an iodide ion (I$^-$), and acid groups such as carboxylate (—COO$^-$), sulfonate (—SO$_3^-$), and alcoholate (—O$^-$). This compound is available as a commercial product. This compound can also be produced, for example, by a reaction of a pyridine with a halogenated alkyl or aryl such as lauryl chloride, benzyl chloride, benzyl bromide, methyl bromide, or octyl bromide. Examples of the compound include N-laurylpyridinium chloride and N-benzylpyridinium bromide.

The compound of Formula (D-5) is a quaternary ammonium salt derived from substituted pyridine typified by picoline. $R^{29}$ is a $C_{1-18}$ alkyl or aryl group, and preferably a $C_{4-18}$ alkyl or aryl group. Examples thereof include methyl group, octyl group, lauryl group, and benzyl group. $R^{30}$ is a $C_{1-18}$ alkyl or aryl group. For example, when the compound is a quaternary ammonium salt derived from picoline, $R^{30}$ is a methyl group. Examples of the anion ($Y^-$) include halide ions such as a chloride ion (Cl$^-$), a bromide ion (Br$^-$), and an iodide ion (I$^-$), and acid groups such as carboxylate (—COO$^-$), sulfonate (—SO$_3^-$), and alcoholate (—O$^-$). This compound is available as a commercial product. This compound can also be produced, for example, by a reaction of substituted pyridine such as picoline with a halogenated alkyl or aryl such as methyl bromide, octyl bromide, lauryl chloride, benzyl chloride, or benzyl bromide. Examples of the compound include N-benzylpicolinium chloride, N-benzylpicolinium bromide, and N-laurylpicolinium chloride.

The compound of Formula (D-6) is a tertiary ammonium salt derived from an amine, wherein m is an integer of 2 to 11, and n is an integer of 2 or 3. Examples of the anion (Y⁻) include halide ions such as a chloride ion (Cl⁻), a bromide ion (Br⁻), and an iodide ion (I⁻), and acid groups such as carboxylate (—COO⁻), sulfonate (—$SO_3^-$), and alcoholate (—O⁻). This compound can be produced by a reaction of an amine with a weak acid such as a carboxylic acid or phenol. Examples of the carboxylic acid include formic acid and acetic acid. In a case of using formic acid, the anion (Y⁻) is (HCOO⁻). In a case of using acetic acid, the anion (Y⁻) is ($CH_3COO^-$). In a case of using phenol, the anion (Y⁻) is ($C_6H_5O^-$).

The compound of Formula (D-7) is a quaternary phosphonium salt having a structure of $R^{31}R^{32}R^{33}R^{34}P^+Y^-$. $R^{31}$, $R^{32}$, $R^{33}$, and $R^{34}$ are a $C_{1-18}$ alkyl or aryl group, or a silane compound bonded to a silicon atom through a Si—C bond. It is preferable that three substituents among four substituents of $R^{31}$ to $R^{34}$ be phenyl groups or substituted phenyl groups such as a phenyl group and a tolyl group, and the rest be a $C_{1-18}$ alkyl or aryl group or a silane compound bonded to a silicon atom through a Si—C bond. Examples of the anion (Y⁻) include halide ions such as a chloride ion (Cl⁻), a bromide ion (Br⁻), and an iodide ion (I⁻), and acid groups such as carboxylate (—COO⁻), sulfonate (—$SO_3^-$), and alcoholate (—O⁻). This compound is available as a commercial product. Examples thereof include tetraalkylphosphonium halide such as tetra-n-butylphosphonium halide and tetra-n-propylphosphonium halide, trialkylbenzylphosphonium halide such as triethylbenzylphosphonium halide, triphenylmonoalylphosphonium halide such as triphenylmethylphosphonium halide and triphenylethylphosphonium halide, triphenylbenzylphosphonium halide, tetraphenylphosphonium halide, tritolylmonoarylphosphonium halide, or tritolylmonoalkylphosphonium halide (a halogen atom is a chlorine atom or a bromine atom). In particular, triphenylmonoalkylphosphonium halide such as triphenylmethylphosphonium halide and triphenylethylphosphonium halide, triphenylmonoarylphosphonium halide such as triphenylbenzylphosphonium halide, tritolylmonoarylphosphonium halide such as tritolylmonophenylphosphonium halide, and tritolylmonoalkylphosphonium halide such as tritolylmonomethylphosphonium halide (a halogen atom is a chlorine atom or a bromine atom) are preferable.

Examples of the phosphine include primary phosphines such as methylphosphine, ethylphosphine, propylphosphine, isopropylphosphine, isobutylphosphine, and phenylphosphine; secondary phosphines such as dimethylphosphine, diethylphosphine, diisopropylphosphine, diisoamylphosphine, and diphenylphosphine; and tertiary phosphines such as trimethylphosphine, triethylphosphine, triphenylphosphine, methyldiphenylphosphine, and dimethylphenylphosphine.

The compound of Formula (D-8) is a tertiary sulfonium salt having a structure of $R^{35}R^{36}R^{37}S^+Y^-$. $R^{35}$, $R^{36}$, and $R^{37}$ are a $C_{1-18}$ alkyl or aryl group, or a silane compound bonded to a silicon atom through a Si—C bond. It is preferable that two substituents among three substituents of $R^{35}$ to $R^{37}$ be phenyl groups or substituted phenyl groups such as a phenyl group and a tolyl group, and the rest be a $C_{1-18}$ alkyl or aryl group. Examples of the anion (Y⁻) include halide ions such as a chloride ion (Cl⁻), a bromide ion (Br⁻), and an iodide ion (I⁻), and acid groups such as carboxylate (—COO⁻), sulfonate (—$SO_3^-$), alcoholate (—O⁻), maleic acid anion, and nitric acid anion. This compound is available as a commercial product. Examples thereof include trialkylsulfonium halide such as tri-n-butylsulfonium halide and tri-n-propylsulfonium halide, trialkylbenzylsulfonium halide such as diethylbenzylsulfonium halide, diphenylmonoalkylsulfonium halide such as diphenylmethylsulfonium halide and diphenylethylsulfonium halide, triphenylsulfonium halide (a halogen atom is a chlorine atom or a bromine atom), trialkylsulfonium carboxylate such as tri-n-butylsulfonium carboxylate and tri-n-propylsulfonium carboxylate, dialkylbenzylsulfonium carboxylate such as diethylbenzylsulfonium carboxylate, diphenylmonoalkylsulfonium carboxylate such as diphenylmethylsulfonium carboxylate and diphenylethylsulfonium carboxylate, and triphenylsulfonium carboxylate. Triphenylsulfonium halide or triphenylsulfonium carboxylate can be preferably used.

In the present invention, a nitrogen-containing silane compound may be added as the curing catalyst. Examples of the nitrogen-containing silane compound include imidazole ring-containing silane compounds such as N-(3-triethoxysilylpropyl)-4,5-dihydroimidazole.

The amount of the curing catalyst is 0.01 parts by mass to 10 parts by mass, 0.01 parts by mass to 5 parts by mass, or 0.01 parts by mass to 3 parts by mass, relative to 100 parts by mass of the polyorganosiloxane.

The hydrolysis-condensate (polymer) obtained by hydrolysis-condensation of the hydrolysable silane in the solvent using the catalyst can be subjected to vacuum distillation or the like, to remove an alcohol as a by-product, the used hydrolysis catalyst, and water at once. Further, the acid and base catalysts used in hydrolysis can be removed by neutralization or ion exchange. In the polysiloxane-containing coating composition of the present invention, the coating composition containing the hydrolysis-condensate (polysiloxane) may contain an organic acid, an alcohol, or a combination thereof for stabilization.

Examples of the organic acid include oxalic acid, malonic acid, methylmalonic acid, succinic acid, maleic acid, trifluoroacetic acid, malic acid, tartaric acid, phthalic acid, citric acid, glutaric acid, citric acid, lactic acid, and salicylic acid. Among the organic acids, oxalic acid and maleic acid are preferable. The amount of organic acid to be added is 0.1 parts by mass to 5.0 parts by mass relative to 100 parts by mass of the condensate (polyorganosiloxane).

An alcohol to be added is preferably an alcohol that is easily evaporated with heat after coating, and examples thereof include methanol, ethanol, propanol, isopropanol, and butanol. The amount of alcohol to be added is 1 part by mass to 20 parts by mass relative to 100 parts by mass of the polysiloxane-containing coating composition.

The polysiloxane-containing coating composition may contain an acid and one or more selected from the group consisting of curing catalysts.

In addition, the polysiloxane-containing coating composition of the present invention may contain an organic polymer compound, a photoacid generator, a surfactant, and the like, if necessary.

When the organic polymer compound is used, the dry etching rate (the amount of reduced film thickness per unit time), attenuation coefficient, and refractive index of a resist underlayer film formed from the polysiloxane-containing coating composition of the present invention can be adjusted.

Examples of the photoacid generator contained in the polysiloxane-containing coating composition of the present invention include an onium salt compound, a sulfonimide compound, and a disulfonyldiazomethane compound.

Examples of the onium salt compound include iodonium salt compounds such as diphenyliodonium hexafluorophosphate, diphenyliodonium trifluoromethanesulfonate, diphenyliodonium nonafluoro-n-butanesulfonate, diphenyliodonium perfluoro-n-octanesulfonate, diphenyliodonium camphorsulfonate, bis(4-tert-butylphenyl)iodonium camphorsulfonate, and bis(4-tert-butylphenyl)iodonium trifluoromethanesulfonate; and sulfonium salt compounds such as triphenylsulfonium hexafluoroantimonate, triphenylsulfonium nonafluoro-n-butanesulfonate, triphenylsulfonium camphorsulfonate, and triphenylsulfonium trifluoromethanesulfonate.

Examples of the sulfonimide compound include N-(trifluoromethanesulfonyloxy)succinimide, N-(nonafluoro-n-butanesulfonyloxy)succinimide, N-(camphorsulfonyloxy)succinimide, and N-(trifluoromethanesulfonyloxy)naphthalimide.

Examples of the disulfonyldiazomethane compound include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

Only one type of the photoacid generator may be used or two or more types thereof may be used in combination.

When the photoacid generator is used, the amount thereof is 0.01 parts by mass to 15 parts by mass, 0.1 parts by mass to 10 parts by mass, or 0.5 parts by mass to 1 part by mass, relative to 100 parts by mass of the condensate (polyorganosiloxane).

The surfactant is effective for suppressing generation of pinholes and striations during applying the polysiloxane-containing coating composition of the present invention to a substrate.

Examples of the surfactant contained in the polysiloxane-containing coating composition of the present invention include nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine surfactants including trade name Eftop EF301, EF303, and EF352 (available from Tohkem Products Corporation), trade name MEGAFACE F171, F173, R-08, R-30, R-30N, and R-40LM (available from DIC Corporation), Fluorad FC430 and FC431 (available from Sumitomo 3M Limited), and trade name AsahiGuard AG710, and Surflon S-382, SC101, SC102, SC103, SC104, SC105, and SC106 (available from Asahi Glass Co., Ltd.); and organosiloxane polymer KP341 (available from Shin-Etsu Chemical Co., Ltd.). The surfactants may be used alone or two or more types thereof may be used in combination. When the surfactant is used, the amount thereof is 0.0001 parts by mass to 5 parts by mass, 0.001 parts by mass to 1 part by mass, or 0.01 parts by mass to 1 part by mass, relative to 100 parts by mass of the condensate (polyorganosiloxane).

The polysiloxane-containing coating composition of the present invention may contain a rheology modifier, an adhesion adjuvant, and the like. The rheology modifier is effective for improving the flowability of the polysiloxane-containing coating composition. The adhesion adjuvant is effective for enhancing the adhesion of the coating composition to a semiconductor substrate.

The solvent used for the polysiloxane-containing coating composition of the present invention can be used without particular limitation as long as it can dissolve the solid content. Examples of such a solvent include methyl cellosolve acetate, ethyl cellosolve acetate, propylene glycol, propylene glycol monomethyl ether, propylene glycol monoethyl ether, methylisobutyl carbinol, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether, propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxyacetate, ethyl 2-hydroxy-2-methylpropionate, methyl 3-methoxy-2-methylpropionate, methyl 2-hydroxy-3-methylbutyrate, ethyl methoxyacetate, ethyl ethoxyacetate, methyl 3-methoxypropionate, ethyl 3-ethoxypropionate, ethyl 3-methoxypropionate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, methyl propyl ketone, methyl butyl ketone, 2-heptanone, 3-heptanone, 4-heptanone, N,N-dimethylformamide, N-methylacetamide, N,N-dimethylacetamide, N-methylpyrrolidone, 4-methyl-2-pentanol, and γ-butyrolactone. The solvents may be used alone or two or more types thereof may be used in combination.

An organic underlayer film used in the present invention is obtained by applying an organic underlayer film-forming composition followed by curing. The composition can be cured by heating at about 150° C. to about 230° C. The organic underlayer film-forming composition may contain a coating film resin and a solvent. The organic underlayer film-forming composition may contain a crosslinker, an acid, an acid generator, a light-absorbing compound, and the like, if necessary. The coating film resin is a resin mainly capable of film formation, and examples thereof include a novolac resin, a condensing epoxy-based resin, a (meth)acrylic resin, a polyether-based resin, or a silicon-containing resin. The solid content of the composition is 0.1% by mass to 70% by mass or 0.1% by mass to 60% by mass. The solid content means the content of all components of the film-forming composition except for the solvent. The content of the coating film resin in the solid content may be 1% by mass to 99.9% by mass, 50% by mass to 99.9% by mass, 50% by mass to 95% by mass, or 50% by mass to 90% by mass. The weight average molecular weight of the coating film resin is 600 to 1,000,000 or 600 to 200,000.

A silicon hard mask used in the present invention is obtained by applying a silicon hard mask-forming composition followed by curing. Examples of the composition include a condensate obtained by hydrolysis of a hydrolysable silane, which is a polysiloxane and includes an organopolysiloxane. The condensate obtained by hydrolysis of a hydrolysable silane is obtained by hydrolysis of at least one selected from the group consisting of a hydrolysable silane having four hydrolysable groups, a hydrolysable silane having three hydrolysable groups, a hydrolysable silane having two hydrolysable groups, and a hydrolysable silane having a hydrolysable group. The hydrolysis is carried out in an organic solvent by addition of a catalyst (e.g., an acid catalyst or a basic catalyst), and condensation is then carried out by heating. Thus, the hydrolysis-condensate (a polysiloxane or an organopolysiloxane) is obtained. The solid content of the composition is 0.1% by mass to 70% by mass or 0.1% by mass to 60% by mass. The solid content means the content of all components of the film-forming composition except for the solvent. The content of the coating film resin in the solid content may be 1% by mass to 99.9% by mass, 50% by mass to 99.9% by mass, 50% by mass to 95% by mass, or 50% by mass to 90% by mass. The weight average molecular weight of the coating film resin is 600 to 1,000,000 or 600 to 200,000.

The silicon hard mask can also be formed by vapor deposition.

In the present invention, the composition used in the present invention is applied to a substrate used to produce semiconductor devices (e.g., a silicon wafer substrate, a silicon/silicon dioxide-coating substrate, a silicon nitride substrate, a glass substrate, an ITO substrate, a polyimide substrate, and a low-dielectric constant material (low-k material)-coating substrate) by an appropriate coating method such as a spinner and a coater.

The composition is baked to form a film. A baking condition is appropriately selected from a baking temperature of 80° C. to 250° C. and a baking time of 0.3 minutes to 60 minutes, and is preferably a baking temperature of 150° C. to 250° C. and a baking time of 0.5 minutes to 2 minutes. The thickness of the formed film is, for example, 10 nm to 1,000 nm, 20 nm to 500 nm, 50 nm to 300 nm, or 100 nm to 200 nm.

For example, a layer of a photoresist is formed on the hard mask. The layer of a photoresist can be formed by a known method, that is, by applying a photoresist composition solution to the underlayer film followed by baking. The film thickness of the photoresist is, for example, 50 nm to 10,000 nm, 100 nm to 2,000 nm, or 200 nm to 1,000 nm.

In the present invention, after formation of the organic underlayer film on the substrate, the hard mask can be formed on the organic underlayer film, and the photoresist can be applied to the hard mask. In this case, even when the photoresist is thinly applied to prevent pattern collapse due to a decrease in pattern width of the photoresist, the substrate can be processed by appropriate selection of etching gas. For example, when a fluorine-based gas that achieves sufficiently high etching rate for the photoresist is used as an etching gas, the hard mask can be processed. When an oxygen-based gas that achieves sufficiently high etching rate for the hard mask is used as an etching gas, the organic underlayer film can be processed. Further, the substrate can be processed by using an inverted pattern.

The photoresist is not particularly limited as long as it is sensitive to light used in exposure. Any of a negative photoresist and a positive photoresist can be used. Examples thereof include a positive photoresist including a novolac resin and 1,2-naphthoquinone diazidesulfonic acid ester; a chemically amplified photoresist including a binder having a group that is decomposed by an acid to increase the alkali dissolution rate, and a photoacid generator, a chemically amplified photoresist including a low molecular compound that is decomposed by an acid to increase the alkali dissolution rate of the photoresist, an alkali-soluble binder, and a photoacid generator; and a chemically amplified photoresist including a binder having a group that is decomposed by an acid to increase the alkali dissolution rate, a low molecular compound that is decomposed by an acid to increase the alkali dissolution rate of the photoresist, and a photoacid generator. Examples thereof include trade name APEX-E available from Shipley Company L.L.C., trade name PAR710 available from Sumitomo Chemical Co., Ltd., and trade name SEPR430 available from Shin-Etsu Chemical Co., Ltd. Further examples thereof include fluorine atom-containing polymer-based photoresists described in Proc. SPIE, Vol. 3999, 330-334 (2000), Proc. SPIE, Vol. 3999, 357-364 (2000), and Proc. SPIE, Vol. 3999, 365-374 (2000).

Next, exposure through a predetermined mask is carried out. In the exposure, a KrF excimer laser (wavelength: 248 nm), an ArF excimer laser (wavelength: 193 nm), a F2 excimer laser (wavelength: 157 nm), or the like, can be used. After the exposure, post exposure bake can be carried out, if necessary. The post exposure bake is carried out under conditions appropriately selected from a heating temperature of 70° C. to 150° C. and a heating time of 0.3 minutes to 10 minutes.

In the present invention, a resist for electron beam lithography or a resist for EUV lithography can be used as a resist instead of the photoresist. As an electron beam resist, any of a negative resist and a positive resist can be used. Examples thereof include a chemically amplified resist including an acid generator and a binder having a group that is decomposed by an acid to change the alkali dissolution rate; a chemically amplified resist including an alkali-soluble binder, an acid generator, and a low molecular compound that is decomposed by an acid to change the alkali dissolution rate of the resist; a chemically amplified resist including an acid generator, a binder having a group that is decomposed by an acid to change the alkali dissolution rate, and a low molecular compound that is decomposed by an acid to change the alkali dissolution rate of the resist; a nonchemically amplified resist including a binder having a group that is decomposed by an electron beam to change the alkali dissolution rate; and a nonchemically amplified resist including a binder having a moiety that is cleaved by an electron beam to change the alkali dissolution rate. When these electron beam resists are used, a resist pattern can be formed similarly to a case of using an electron beam as an irradiation source and a photoresist.

As an EUV resist, a methacrylate resin-based resist, a methacrylate-polyhydroxystyrene hybrid resin-based resist, or a polyhydroxystyrene resin-based resist can be used. As the EUV resist, any of a negative resist and a positive resist can be used. Examples thereof include a chemically amplified resist including an acid generator and a binder having a group that is decomposed by an acid to change the alkali dissolution rate; a chemically amplified resist including an alkali-soluble binder, an acid generator, and a low molecular compound that is decomposed by an acid to change the alkali dissolution rate of the resist; a chemically amplified resist including an acid generator, a binder having a group that is decomposed by an acid to change the alkali dissolution rate, and a low molecular compound that is decomposed by an acid to change the alkali dissolution rate of the resist; a nonchemically amplified resist including a binder having a group that is decomposed by EUV light to change the alkali dissolution rate; and a nonchemically amplified resist including a binder having a moiety that is cleaved by EUV light to change the alkali dissolution rate.

Subsequently, development by a developer (e.g., alkaline developer) is carried out. For example, when the positive photoresist is used, the photoresist at an exposed area is removed by the development, to form a pattern of the photoresist.

Examples of the developer include alkaline aqueous solutions including an aqueous solution of alkali metal hydroxides such as potassium hydroxide and sodium hydroxide, an aqueous solution of quaternary ammonium hydroxides such as tetramethylammonium hydroxide, tetraethylammonium hydroxide, and choline, and an aqueous solution of amines such as ethanolamine, propylamine, and ethylenediamine. Further, a surfactant or the like can be added to the developer. A development condition is appropriately selected from a temperature of 5° C. to 50° C. and a time of 10 seconds to 600 seconds.

In the present invention, an organic solvent can be used as the developer. After exposure, development by a developer (solvent) is carried out. For example, when the positive photoresist is used, the photoresist at an unexposed area is removed by development, to form a pattern of the photoresist.

Examples of the developer include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl 3-methoxypropionate, ethyl 3-methoxypropionate, ethyl 3-ethoxypropionate, and propyl 3-methoxypropionate. Further, a surfactant or the like can be added to the developer. A development condition is appropriately selected from a temperature of 5° C. to 50° C. and a time of 10 seconds to 600 seconds.

In the present invention, a method in which the composition of the present invention is applied to the organic underlayer film pattern obtained by transferring the resist pattern to the underlayer and the organic underlayer film is etched to impart an inverted pattern to the composition of the present invention is used.

The hard mask at an area where the photoresist is removed is first removed by dry etching to exposure the organic underlayer film. In the dry etching of the hard mask, a gas such as tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride, chlorine trifluoride, chlorine, trichloroborane, and dichloroborane can be used. In the dry etching of the hard mask, a halogen-containing gas is preferably used. In general, a photoresist formed from an organic substance is hardly removed by dry etching with a halogen-containing gas. However, a hard mask containing a large amount of silicon atom is rapidly removed by dry etching with a halogen-containing gas. Therefore, a decrease in film thickness of photoresist by dry etching of the hard mask can be suppressed. Accordingly, the photoresist can be used as a thin film. In the dry etching of the hard mask, a fluorine-containing gas is preferable. Examples thereof include tetrafluoromethane ($CF_4$), perfluorocyclobutane ($C_4F_8$), perfluoropropane ($C_3F_8$), trifluoromethane, and difluoromethane ($CH_2F_2$).

The organic underlayer film is removed using a film including the patterned photoresist and the hard mask as a protective film. It is preferable that the organic underlayer film (underlayer) be dry-etched with an oxygen-based gas. This is because the hard mask containing a large amount of silicon atom is hardly removed by dry etching with the oxygen-based gas.

As a gas used in an etch back process, the fluorine-containing gas is used in a step of applying the polysiloxane-containing coating composition to the patterned organic underlayer film and exposing a surface of the organic underlayer film by the etch back process. By etching or ashing of the organic underlayer film, an inverted pattern can be obtained. In a step of processing the substrate using the polysiloxane film, a semiconductor device can be produced.

EXAMPLES

Synthesis Example 1

95.64 g (60% by mole relative to the total amount of silanes) of tetraethoxysilane, 54.57 g (40% by mole relative to the total amount of silanes) of methyltriethoxysilane, and 100.14 g of acetone were placed in a flask. A condenser was attached to this flask, and a dropping funnel containing 49.64 g of prepared aqueous hydrochloric acid solution (0.01 mol/L) was placed. The aqueous hydrochloric acid solution was slowly added dropwise at room temperature. The mixture was stirred for several minutes, and then reacted in an oil bath at 85° C. for 4 hours. After completion of the reaction, the flask containing the reaction solution was allowed to cool, and then attached to an evaporator. Ethanol produced in the reaction was removed to obtain a reaction product (polysiloxane) (corresponding to Formula (1-1)). Acetone was replaced by propylene glycol monoethyl ether using the evaporator. The solid content in the obtained reaction product was measured by a baking method, to be 20.66% by mass. The molecular weight (Mw) of the obtained product (solid content) was 1,760.

57.51 g of the obtained polysiloxane, 42.37 g of propylene glycol monoethyl ether, and 0.119 g of maleic acid were placed in a flask. A condenser was attached to this flask. The mixture was reacted in an oil bath at 60° C. for 15 hours to synthesize a modified polysiloxane in which a silanol group of the polysiloxane was capped. The solid content in the obtained reaction product was measured by a baking method, to be 11.59% by mass. The molecular weight (Mw) of the obtained product (solid content) was 1,780. The polysiloxane was mixed at a ratio of Table below, and filtered through a filter with a pore diameter of 0.1 μm to obtain a polysiloxane-containing coating composition for pattern inversion.

Synthesis Example 2

109.68 g (70% by mole relative to the total amount of silanes) of tetraethoxysilane, 40.23 g (30% by mole relative to the total amount of silanes) of methyltriethoxysilane, and 99.94 g of acetone were placed in a flask. A condenser was attached to this flask, and a dropping funnel containing 50.15 g of prepared aqueous hydrochloric acid solution (0.01 mol/L) was placed. The aqueous hydrochloric acid solution was slowly added dropwise at room temperature. The mixture was stirred for several minutes, and then reacted in an oil bath at 85° C. for 4 hours. After completion of the reaction, the flask containing the reaction solution was allowed to cool, and then attached to an evaporator. Ethanol produced in the reaction was removed to obtain a reaction product (polysiloxane) (corresponding to Formula (1-1)). Acetone was replaced by propylene glycol monoethyl ether using the evaporator. The solid content in the obtained reaction product was measured by a baking method, to be 21.80% by mass. The molecular weight (Mw) of the obtained product (solid content) was 2,050.

54.50 g of the obtained polysiloxane, 45.38 g of propylene glycol monoethyl ether, and 0.119 g of maleic acid were placed in a flask. A condenser was attached to this flask. The mixture was reacted in an oil bath at 60° C. for 15 hours to synthesize a modified polysiloxane in which a silanol group of the polysiloxane was capped. The solid content in the obtained reaction product was measured by a baking method, to be 11.10% by mass. The molecular weight (Mw) of the obtained product (solid content) was 2,090. The polysiloxane was mixed at a ratio of Table below, and filtered through a filter with a pore diameter of 0.1 μm to obtain a polysiloxane-containing coating composition for pattern inversion.

Synthesis Example 3

116.52 g (75% by mole relative to the total amount of silanes) of tetraethoxysilane, 33.24 g (25% by mole relative to the total amount of silanes) of methyltriethoxysilane, and 99.84 g of acetone were placed in a flask. A condenser was attached to this flask, and a dropping funnel containing 50.36 g of prepared aqueous hydrochloric acid solution (0.01 mol/L) was placed. The aqueous hydrochloric acid solution was slowly added dropwise at room temperature. The mixture was stirred for several minutes, and then reacted in an oil bath at 85° C. for 4 hours. After completion of the reaction, the flask containing the reaction solution was allowed to cool, and then attached to an evaporator. Ethanol produced in the reaction was removed to obtain a reaction product (polysiloxane) (corresponding to Formula (1-1)). Acetone was replaced by propylene glycol monoethyl ether using the evaporator. The solid content in the obtained reaction product was measured by a baking method, to be 19.64% by mass. The molecular weight (Mw) of the obtained product (solid content) was 2,350.

60.49 g of the obtained polysiloxane, 39.39 g of propylene glycol monoethyl ether, and 0.119 g of maleic acid were placed in a flask. A condenser was attached to this flask. The mixture was reacted in an oil bath at 60° C. for 15 hours to synthesize a modified polysiloxane in which a silanol group of the polysiloxane obtained in Synthesis Example 1 was capped. The solid content in the obtained reaction product was measured by a baking method, to be 11.89% by mass. The molecular weight (Mw) of the obtained product (solid content) was 2,380. The polysiloxane was mixed at a ratio of Table below, and filtered through a filter with a pore diameter of 0.1 μm to obtain a polysiloxane-containing coating composition for pattern inversion.

Synthesis Example 4

123.25 g (80% by mole relative to the total amount of silanes) of tetraethoxysilane, 26.37 g (20% by mole relative to the total amount of silanes) of methyltriethoxysilane, and 99.74 g of acetone were placed in a flask. A condenser was attached to this flask, and a dropping funnel containing 50.64 g of prepared aqueous hydrochloric acid solution (0.01 mol/L) was placed. The aqueous hydrochloric acid solution was slowly added dropwise at room temperature. The mixture was stirred for several minutes, and then reacted in an oil bath at 85° C. for 4 hours. After completion of the reaction, the flask containing the reaction solution was allowed to cool, and then attached to an evaporator. Ethanol produced in the reaction was removed to obtain a reaction product (polysiloxane) (corresponding to Formula (1-1)). Acetone was replaced by propylene glycol monoethyl ether using the evaporator. The solid content in the obtained reaction product was measured by a baking method, to be 20.22% by mass. The molecular weight (Mw) of the obtained product (solid content) was 2,460.

58.76 g of the obtained polysiloxane, 41.12 g of propylene glycol monoethyl ether, and 0.119 g of maleic acid were placed in a flask. A condenser was attached to this flask. The mixture was reacted in an oil bath at 60° C. for 15 hours to synthesize a modified polysiloxane in which a silanol group of the polysiloxane obtained in Synthesis Example 1 was capped. The solid content in the obtained reaction product was measured by a baking method, to be 11.90% by mass. The molecular weight (Mw) of the obtained product (solid content) was 2,470. The polysiloxane was mixed at a ratio of Table below, and filtered through a filter with a pore diameter of 0.1 μm to obtain a polysiloxane-containing coating composition for pattern inversion.

Synthesis Example 5

136.36 g (90% by mole relative to the total amount of silanes) of tetraethoxysilane, 12.97 g (10% by mole relative to the total amount of silanes) of methyltriethoxysilane, and 99.55 g of acetone were placed in a flask. A condenser was attached to this flask, and a dropping funnel containing 51.11 g of prepared aqueous hydrochloric acid solution (0.01 mol/L) was placed. The aqueous hydrochloric acid solution was slowly added dropwise at room temperature. The mixture was stirred for several minutes, and then reacted in an oil bath at 85° C. for 4 hours. After completion of the reaction, the flask containing the reaction solution was allowed to cool, and then attached to an evaporator. Ethanol produced in the reaction was removed to obtain a reaction product (polysiloxane) (corresponding to Formula (1-1)). Acetone was replaced by propylene glycol monoethyl ether using the evaporator. The solid content in the obtained reaction product was measured by a baking method, to be 19.62% by mass. The molecular weight (Mw) of the obtained product (solid content) was 2,840.

60.56 g of the obtained polysiloxane, 39.32 g of propylene glycol monoethyl ether, and 0.119 g of maleic acid were placed in a flask. A condenser was attached to this flask. The mixture was reacted in an oil bath at 60° C. for 15 hours to synthesize a modified polysiloxane in which a silanol group of the polysiloxane obtained in Synthesis Example 1 was capped. The solid content in the obtained reaction product was measured by a baking method, to be 11.45% by mass. The molecular weight (Mw) of the obtained product (solid content) was 2,860. The polysiloxane was mixed at a ratio of Table below, and filtered through a filter with a pore diameter of 0.1 μm to obtain a polysiloxane-containing coating composition for pattern inversion.

Synthesis Example 6

149.06 g (100% by mole relative to the total amount of silanes) of tetraethoxysilane and 99.37 g of acetone were placed in a flask. A condenser was attached to this flask, and a dropping funnel containing 51.59 g of prepared aqueous hydrochloric acid solution (0.01 mol/L) was placed. The aqueous hydrochloric acid solution was slowly added dropwise at room temperature. The mixture was stirred for several minutes, and then reacted in an oil bath at 85° C. for 4 hours. After completion of the reaction, the flask containing the reaction solution was allowed to cool, and then attached to an evaporator. Ethanol produced in the reaction was removed to obtain a reaction product (polysiloxane) (corresponding to Formula (1-2)). Acetone was replaced by propylene glycol monoethyl ether using the evaporator. The solid content in the obtained reaction product was measured by a baking method, to be 18.99% by mass. The molecular weight (Mw) of the obtained product (solid content) was 3,050.

62.57 g of the obtained polysiloxane, 37.32 g of propylene glycol monoethyl ether, and 0.119 g of maleic acid were placed in a flask. A condenser was attached to this flask. The mixture was reacted in an oil bath at 60° C. for 15 hours to synthesize a modified polysiloxane in which a silanol group of the polysiloxane obtained in Synthesis Example 1 was capped. The solid content in the obtained reaction product was measured by a baking method, to be 11.23% by mass. The molecular weight (Mw) of the obtained product (solid content) was 3,070. The polysiloxane was mixed at a ratio of Table below, and filtered through a filter with a pore diameter of 0.1 μm to obtain a polysiloxane-containing coating composition for pattern inversion.

Synthesis Example 7

116.52 g (75% by mole relative to the total amount of silanes) of tetraethoxysilane, 33.24 g (25% by mole relative to the total amount of silanes) of methyltriethoxysilane, and 99.84 g of acetone were placed in a flask. A condenser was attached to this flask, and a dropping funnel containing 50.36 g of prepared aqueous hydrochloric acid solution (0.01 mol/L) was placed. The aqueous hydrochloric acid solution was slowly added dropwise at room temperature. The mixture was stirred for several minutes, and then reacted in an oil bath at 85° C. for 4 hours. After completion of the reaction, the flask containing the reaction solution was allowed to cool, and then attached to an evaporator. Ethanol produced in the reaction was removed to obtain a reaction product (polysiloxane) (corresponding to Formula (1-1)). Acetone was replaced by propylene glycol monomethyl ether using the evaporator. The solid content in the obtained reaction product was measured by a baking method, to be 21.12% by mass. The molecular weight (Mw) of the obtained product (solid content) was 2,430.

60.01 g of the obtained polysiloxane, 40.10 g of propylene glycol monomethyl ether, and 0.120 g of maleic acid were placed in a flask. A condenser was attached to this flask. The mixture was reacted in an oil bath at 60° C. for 15 hours to synthesize a modified polysiloxane in which a silanol group of the polysiloxane was capped. The solid content in the obtained reaction product was measured by a baking method, to be 12.12% by mass. The molecular weight (Mw) of the obtained product (solid content) was 2,300. The polysiloxane was mixed at a ratio of Table below, and filtered through a filter with a pore diameter of 0.1 μm to obtain a polysiloxane-containing coating composition for pattern inversion.

Synthesis Example 8

116.52 g (75% by mole relative to the total amount of silanes) of tetraethoxysilane, 33.24 g (25% by mole relative to the total amount of silanes) of methyltriethoxysilane, and 99.84 g of acetone were placed in a flask. A condenser was attached to this flask, and a dropping funnel containing 50.36 g of prepared aqueous hydrochloric acid solution (0.01 mol/L) was placed. The aqueous hydrochloric acid solution was slowly added dropwise at room temperature. The mixture was stirred for several minutes, and then reacted in an oil bath at 85° C. for 4 hours. After completion of the reaction, the flask containing the reaction solution was allowed to cool, and then attached to an evaporator. Ethanol produced in the reaction was removed to obtain a reaction product (polysiloxane) (corresponding to Formula (1-1)). Acetone was replaced by 3-methoxybutanol using the evaporator. The solid content in the obtained reaction product was measured by a baking method, to be 20.13% by mass. The molecular weight (Mw) of the obtained product (solid content) was 2,230.

60.13 g of the obtained polysiloxane, 40.03 g of 3-methoxybutanol, and 0.120 g of maleic acid were placed in a flask. A condenser was attached to this flask. The mixture was reacted in an oil bath at 60° C. for 15 hours to synthesize a modified polysiloxane in which a silanol group of the polysiloxane was capped. The solid content in the obtained reaction product was measured by a baking method, to be 12.08% by mass. The molecular weight (Mw) of the obtained product (solid content) was 2,250. The polysiloxane was mixed at a ratio of Table below, and filtered through a filter with a pore diameter of 0.1 μm to obtain a polysiloxane-containing coating composition for pattern inversion.

Synthesis Example 9

117.25 g (75% by mole relative to the total amount of silanes) of tetraethoxysilane, 26.76 g (20% by mole relative to the total amount of silanes) of methyltriethoxysilane, 5.56 g (5% by mole relative to the total amount of silanes) of dimethyltriethoxysilane, and 99.72 g of acetone were placed in a flask. A condenser was attached to this flask, and a dropping funnel containing 50.71 g of prepared aqueous hydrochloric acid solution (0.01 mol/L) was placed. The aqueous hydrochloric acid solution was slowly added dropwise at room temperature. The mixture was stirred for several minutes, and then reacted in an oil bath at 85° C. for 4 hours. After completion of the reaction, the flask containing the reaction solution was allowed to cool, and then attached to an evaporator. Ethanol produced in the reaction was removed to obtain a reaction product (polysiloxane) (corresponding to Formula (1-3)). Acetone was replaced by propylene glycol monoethyl ether using the evaporator. The solid content in the obtained reaction product was measured by a baking method, to be 21.09% by mass. The molecular weight (Mw) of the obtained product (solid content) was 2,150.

56.90 g of the obtained polysiloxane, 42.98 g of propylene glycol monoethyl ether, and 0.120 g of maleic acid were placed in a flask. A condenser was attached to this flask. The mixture was reacted in an oil bath at 60° C. for 15 hours to synthesize a modified polysiloxane in which a silanol group of the polysiloxane was capped. The solid content in the obtained reaction product was measured by a baking method, to be 11.55% by mass. The molecular weight (Mw) of the obtained product (solid content) was 2,180. The polysiloxane was mixed at a ratio of Table below, and filtered through a filter with a pore diameter of 0.1 μm to obtain a polysiloxane-containing coating composition for pattern inversion.

Synthesis Example 10

117.25 g (75% by mole relative to the total amount of silanes) of tetraethoxysilane, 26.75 g (20% by mole relative to the total amount of silanes) of methyltriethoxysilane, 5.56 g (5% by mole relative to the total amount of silanes) of vinyltrimethoxysilane, and 99.71 g of acetone were placed in a flask. A condenser was attached to this flask, and a dropping funnel containing 50.71 g of prepared aqueous hydrochloric acid solution (0.01 mol/L) was placed. The aqueous hydrochloric acid solution was slowly added dropwise at room temperature. The mixture was stirred for several minutes, and then reacted in an oil bath at 85° C. for 4 hours. After completion of the reaction, the flask containing the reaction solution was allowed to cool, and then attached to an evaporator. Ethanol produced in the reaction was removed to obtain a reaction product (polysiloxane) (corresponding to Formula (1-4)). Acetone was replaced by propylene glycol monoethyl ether using the evaporator. The solid content in the obtained reaction product was measured by a baking method, to be 19.89% by mass. The molecular weight (Mw) of the obtained product (solid content) was 2,220.

60.33 g of the obtained polysiloxane, 39.55 g of propylene glycol monoethyl ether, and 0.120 g of maleic acid were placed in a flask. A condenser was attached to this flask. The mixture was reacted in an oil bath at 60° C. for 15 hours to synthesize a modified polysiloxane in which a silanol group of the polysiloxane was capped. The solid content in the obtained reaction product was measured by a baking method, to be 11.57% by mass. The molecular weight (Mw) of the obtained product (solid content) was 2,260. The polysiloxane was mixed at a ratio of Table below, and filtered through a filter with a pore diameter of 0.1 μm to obtain a polysiloxane-containing coating composition for pattern inversion.

Synthesis Example 11

116.04 g (75% by mole relative to the total amount of silanes) of tetraethoxysilane, 26.48 g (20% by mole relative to the total amount of silanes) of methyltriethoxysilane, 7.36 g (5% by mole relative to the total amount of silanes) of phenyltrimethoxysilane, and 99.93 g of acetone were placed in a flask. A condenser was attached to this flask, and a dropping funnel containing 50.19 g of prepared aqueous hydrochloric acid solution (0.01 mol/L) was placed. The aqueous hydrochloric acid solution was slowly added dropwise at room temperature. The mixture was stirred for several minutes, and then reacted in an oil bath at 85° C. for 4 hours. After completion of the reaction, the flask containing the reaction solution was allowed to cool, and then attached to an evaporator. Ethanol produced in the reaction was removed to obtain a reaction product (polysiloxane) (corresponding to Formula (1-5)). Acetone was replaced by propylene glycol monoethyl ether using the evaporator. The solid content in the obtained reaction product was measured by a baking method, to be 20.44% by mass. The molecular weight (Mw) of the obtained product (solid content) was 2,350.

58.71 g of the obtained polysiloxane, 41.17 g of propylene glycol monoethyl ether, and 0.120 g of maleic acid were placed in a flask. A condenser was attached to this flask. The mixture was reacted in an oil bath at 60° C. for 15 hours to synthesize a modified polysiloxane in which a silanol group of the polysiloxane was capped. The solid content in the obtained reaction product was measured by a baking method, to be 11.65% by mass. The molecular weight (Mw) of the obtained product (solid content) was 2,430. The polysiloxane was mixed at a ratio of Table below, and filtered through a filter with a pore diameter of 0.1 μm to obtain a polysiloxane-containing coating composition for pattern inversion.

Comparative Synthesis Example 1

95.64 g (60% by mole relative to the total amount of silanes) of tetraethoxysilane, 54.57 g (40% by mole relative to the total amount of silanes) of methyltriethoxysilane, and 100.14 g of acetone were placed in a flask. A condenser was attached to this flask, and a dropping funnel containing 49.64 g of prepared aqueous hydrochloric acid solution (0.01 mol/L) was placed. The aqueous hydrochloric acid solution was slowly added dropwise at room temperature. The mixture was stirred for several minutes, and then reacted in an oil bath at 85° C. for 4 hours. After completion of the reaction, the flask containing the reaction solution was allowed to cool, and then attached to an evaporator. Ethanol produced in the reaction was removed to obtain a reaction product (polysiloxane) (corresponding to Formula (1-1)).

Acetone was replaced by propylene glycol monomethyl ether acetate using the evaporator. The solid content in the obtained reaction product was measured by a baking method, to be 25.44% by mass. The molecular weight (Mw) of the obtained product (solid content) was 1,850. The polysiloxane was mixed at a ratio of Table below, and filtered through a filter with a pore diameter of 0.1 μm to obtain a polysiloxane-containing coating composition for pattern inversion.

Comparative Synthesis Example 2

109.68 g (70% by mole relative to the total amount of silanes) of tetraethoxysilane, 40.23 g (30% by mole relative to the total amount of silanes) of methyltriethoxysilane, and 99.94 g of acetone were placed in a flask. A condenser was attached to this flask, and a dropping funnel containing 50.15 g of prepared aqueous hydrochloric acid solution (0.01 mol/L) was placed. The aqueous hydrochloric acid solution was slowly added dropwise at room temperature. The mixture was stirred for several minutes, and then reacted in an oil bath at 85° C. for 4 hours. After completion of the reaction, the flask containing the reaction solution was allowed to cool, and then attached to an evaporator. Ethanol produced in the reaction was removed to obtain a reaction product (polysiloxane) (corresponding to Formula (1-1)). Acetone was replaced by propylene glycol monomethyl ether acetate using the evaporator. The solid content in the obtained reaction product was measured by a baking method, to be 21.30% by mass. The molecular weight (Mw) of the obtained product (solid content) was 2,100. The polysiloxane was mixed at a ratio of Table below, and filtered through a filter with a pore diameter of 0.1 μm to obtain a polysiloxane-containing coating composition for pattern inversion.

Measurement of Capping Ratio

The polysiloxane contained in the coating composition of the present invention is obtained by a reaction of an alcohol with a silanol group in a hydrolysis-condensate of a hydrolysable silane. A silanol group of the aforementioned polysiloxane is subjected to a dehydration reaction with an alcohol to form an alkoxy group from an organic component of the reacted alcohol. This polysiloxane is obtained by capping the silanol group.

The ratio of silanol groups in a polymer and the capping ratio of propylene glycol monomethyl ether, propylene glycol monoethyl ether, and 3-methoxybutanol were calculated by $^1$H-NMR. In measurement, JNM-ECA500 (manufactured by JEOL Ltd.) was used. The integration ratio of chemical shift value (0.0 to 0.3 ppm) of a methyl proton of triethoxymethylsilane is determined as a standard. The chemical shift values of methine protons of propylene glycol monomethyl ether and propylene glycol monoethyl ether and of a methylene proton of 3-methoxybutanol are detected at about 3.8 ppm. However, when a bond to a silicon atom is formed by a dehydration-condensation reaction of each of propylene glycol monomethyl ether, propylene glycol monoethyl ether, and 3-methoxybutanol with a silanol group, that is, when a silanol group is subjected to a capping reaction, the chemical shift values of methine protons and methylene proton shift to about 4.2 ppm. The integration ratios of chemical shift values of methine protons and methylene proton that shift to about 4.2 ppm were measured and compared with the determined integration ratio of chemical shift value of methyl proton of triethoxymethylsilane. Thus, the capping ratios of propylene glycol monomethyl ether, propylene glycol monoethyl ether, and 3-methoxybutanol to one silicon atom in the polymer were calculated. The ratio of the amount of a remaining SiOH group to the amount of a capped SiOH group per mole of Si atom in the obtained polysiloxane is shown in Table below. In Table, propylene glycol monoethyl ether is abbreviated as PGEE, propylene glycol monomethyl ether is abbreviated as PGME, and 3-methoxybutanol is abbreviated as MB.

TABLE 1

| Polymer | Solvent | Silanol group/capped silanol group ratio |
| --- | --- | --- |
| Synthesis Example 1 Content | PGEE | SiOH group/SiOH group capped with PGEE 0.56/0.13 |

TABLE 1-continued

| Polymer | Solvent | Silanol group/capped silanol group ratio |
| --- | --- | --- |
| Synthesis Example 2 Content | PGEE | SiOH group/SiOH group capped with PGEE 0.57/0.15 |
| Synthesis Example 3 Content | PGEE | SiOH group/SiOH group capped with PGEE 0.59/0.18 |
| Synthesis Example 4 Content | PGEE | SiOH group/SiOH group capped with PGEE 0.76/0.18 |
| Synthesis Example 5 Content | PGEE | SiOH group/SiOH group capped with PGEE 0.78/0.15 |
| Synthesis Example 6 Content | PGEE | SiOH group/SiOH group capped with PGEE 0.79/0.16 |
| Synthesis Example 7 Content | PGME | SiOH group/SiOH group capped with PGME 0.54/0.14 |
| Synthesis Example 8 Content | MB | SiOH group/SiOH group capped with MB 0.55/0.13 |
| Synthesis Example 9 Content | PGEE | SiOH group/SiOH group capped with PGEE 0.56/0.15 |
| Synthesis Example 10 Content | PGEE | SiOH group/SiOH group capped with PGEE 0.53/0.11 |
| Synthesis Example 11 Content | PGEE | SiOH group/SiOH group capped with PGEE 0.57/0.11 |

Preparation of Polysiloxane-Containing Coating Composition for Pattern Inversion The polysiloxane obtained in each of Synthesis Examples 1 to 11 and Comparative Synthesis Examples 1 and 2, an acid, a curing catalyst, an additive, and a solvent were mixed at a ratio of Tables below. The mixture was filtered through a fluororesin filter with a pore direction of 0.1 μm to prepare a solution of the polysiloxane-containing coating composition. The addition ratio of polymer in Tables below represents the amount of the added polymer, but not the amount of a polymer solution.

In Tables below, maleic acid is abbreviated as MA, trifluoroacetic acid is abbreviated as TFA, benzyltriethylammonium chloride is abbreviated as BTEAC, N-(3-triethyoxysilylpropyl)-4,5-dihydroimidazole is abbreviated as IMID-TEOS, triphenylsulfonium nitrate is abbreviated as TPSNO3, monotriphenylsulfonium maleate is abbreviated as TPSMA, triphenylsulfonium trifluoroacetate is abbreviated as TPSTFA, triphenylsulfonium chloride is abbreviated as TPSCl, triphenylsulfonium camphorsulfonate is abbreviated as TPSCS, triphenylsulfonium trifluoromethanesulfonate is abbreviated as TPSTf, triphenylsulfonium nonafluorobutanesulfonate is abbreviated as TPSNf, triphenylsulfonium adamantanecarboxy-1,1,2-trifluorobutanesulfonate is abbreviated as TPSAdTF, dihydroxyphenylphenylsulfonium p-toluenesulfonate is abbreviated as DHTPPSpTS, bisphenylsulfone is abbreviated as BPS, propylene glycol monomethyl ether acetate is abbreviated as PGMEA, propylene glycol monoethyl ether is abbreviated as PGEE, propylene glycol monomethyl ether is abbreviated as PGME, 3-methoxybutanol is abbreviated as MB, ethyl lactate is abbreviated as EL, and PnP is abbreviated as propylene glycol-n-propyl ether. Each addition amount is expressed in part(s) by mass.

TABLE 2

| | Polymer | Acid | Curing catalyst | Additive | Solvent | |
|---|---|---|---|---|---|---|
| Example 1 (part by mass) | Synthesis Example 3 6.9 | | | | PGME 4.7 | PGEE 88.4 |
| Example 2 (part by mass) | Synthesis Example 3 6.83 | MA 0.07 | | | PGME 4.7 | PGEE 88.4 |
| Example 3 (part by mass) | Synthesis Example 3 6.76 | MA 0.07 | TPSNO3 0.07 | | PGME 4.7 | PGEE 88.4 |
| Example 4 (part by mass) | Synthesis Example 3 6.39 | MA 0.06 | TPSNO3 0.06 | TFA 0.39 | PGME 4.7 | PGEE 88.4 |
| Example 5 (part by mass) | Synthesis Example 3 6.86 | MA 0.07 | TPSNO3 0.07 | | PGEE 93 | |
| Example 6 (part by mass) | Synthesis Example 3 6.86 | MA 0.07 | TPSNO3 0.07 | | PGEE 60 | MB 33 |
| Example 7 (part by mass) | Synthesis Example 3 6.86 | MA 0.07 | TPSNO3 0.07 | | PGEE 60 | EL 33 |
| Example 8 (part by mass) | Synthesis Example 3 6.86 | MA 0.07 | TPSNO3 0.07 | | PGEE 60 | PnP 33 |
| Example 9 (part by mass) | Synthesis Example 3 6.76 | MA 0.07 | BTEAC 0.07 | | PGME 4.7 | PGEE 88.4 |
| Example 10 (part by mass) | Synthesis Example 3 6.76 | MA 0.07 | IMIDTEOS 0.07 | | pgme 4.7 | PGEE 88.4 |

TABLE 3

| | Polymer | Acid | Curing catalyst | Additive | Solvent | |
|---|---|---|---|---|---|---|
| Example 11 (part by mass) | Synthesis Example 3 6.76 | MA 0.07 | TPSMA 0.07 | | PGME 4.7 | PGEE 88.4 |
| Example 12 (part by mass) | Synthesis Example 3 6.76 | MA 0.07 | TPSTFA 0.07 | | PGME 4.7 | PGEE 88.4 |
| Example 13 (part by mass) | Synthesis Example 3 6.76 | MA 0.07 | TPSCl 0.07 | | PGME 4.7 | PGEE 88.4 |
| Example 14 (part by mass) | Synthesis Example 3 6.69 | MA 0.07 | TPSMA 0.07 | TPSCS 0.07 | PGME 4.7 | PGEE 88.4 |
| Example 15 (part by mass) | Synthesis Example 3 6.69 | MA 0.07 | TPSNO3 0.07 | TPSTf 0.07 | PGME 4.7 | PGEE 88.4 |
| Example 16 (part by mass) | Synthesis Example 3 6.69 | MA 0.07 | BTEAC 0.07 | TPSNf 0.07 | PGME 4.7 | PGEE 88.4 |
| Example 17 (part by mass) | Synthesis Example 3 6.69 | MA 0.07 | IMIDTEOS 0.07 | DHTPPS pTS 0.07 | PGME 4.7 | PGEE 88.4 |

TABLE 4

| | Polymer | Acid | Curing catalyst | Additive | Solvent | |
|---|---|---|---|---|---|---|
| Example 18 (part by mass) | Synthesis Example 3 6.69 | MA 0.07 | TPSTFA 0.07 | TPSAdTF 0.07 | PGME 4.7 | PGEE 88.4 |
| Example 19 (part by mass) | Synthesis Example 3 6.69 | MA 0.07 | TPSCl 0.07 | BPS 0.07 | PGME 4.7 | PGEE 88.4 |
| Example 20 (part by mass) | Synthesis Example 3 6.69 | MA 0.07 | TPSNO3 0.07 | TPSAdTF 0.07 | PGME 4.7 | PGEE 88.4 |
| Example 21 (part by mass) | Synthesis Example 1 6.76 | MA 0.07 | TPSNO3 0.07 | | PGME 4.7 | PGEE 88.4 |
| Example 22 (part by mass) | Synthesis Example 2 6.76 | MA 0.07 | TPSNO3 0.07 | | PGME 4.7 | PGEE 88.4 |

TABLE 5

| | Polymer | Acid | Curing catalyst | Additive | Solvent | |
|---|---|---|---|---|---|---|
| Example 23 (part by mass) | Synthesis Example 4 6.76 | MA 0.07 | TPSNO3 0.07 | | PGME 4.7 | PGEE 88.4 |
| Example 24 (part by mass) | Synthesis Example 5 6.76 | MA 0.07 | TPSNO3 0.07 | | PGME 4.7 | PGEE 88.4 |
| Example 25 (part by mass) | Synthesis Example 6 6.76 | MA 0.07 | TPSNO3 0.07 | | PGME 4.7 | PGEE 88.4 |
| Example 26 (part by mass) | Synthesis Example 7 6.76 | MA 0.07 | TPSNO3 0.07 | | PGME 93.1 | |

TABLE 5-continued

|  | Polymer | Acid | Curing catalyst | Additive | Solvent | |
|---|---|---|---|---|---|---|
| Example 27 | Synthesis Example 8 | MA | TPSNO3 |  | PGME | MB |
| (part by mass) | 6.76 | 0.07 | 0.07 |  | 4.7 | 88.4 |
| Example 28 | Synthesis Example 9 | MA | TPSNO3 |  | PGME | PGEE |
| (part by mass) | 6.76 | 0.07 | 0.07 |  | 4.7 | 88.4 |
| Example 29 | Synthesis Example 10 | MA | TPSNO3 |  | PGME | PGEE |
| (part by mass) | 6.76 | 0.07 | 0.07 |  | 4.7 | 88.4 |
| Example 30 | Synthesis Example 11 | MA | TPSNO3 |  | PGME | PGEE |
| (part by mass) | 6.76 | 0.07 | 0.07 |  | 4.7 | 88.4 |
| Comparative Example 1 | Comparative Synthesis Example 1 | MA | TPSNO3 |  | PGME | PGMEA |
| (part by mass) | 6.76 | 0.07 | 0.07 |  | 4.7 | 88.4 |
| Comparative Example 2 | Comparative Synthesis Example 2 | MA | TPSNO3 |  | PGME | PGMEA |
| (part by mass) | 6.76 | 0.07 | 0.07 |  | 4.7 | 88.4 |

Evaluation of Coating Performance

For the polysiloxane-containing coating compositions of Examples 1 to 30 and Comparative Examples 1 and 2, the coating performance was evaluated as follows. The evaluation results are shown in Tables below.

For evaluation of coating performance, the polysiloxane-containing coating composition of each of Examples 1 to 30 and Comparative Examples 1 and 2 was applied to a stepped substrate in FIG. 2 by a spin coater at a rotation number of 1,500 rpm for 60 seconds, and dried on a hot plate at 200° C. for 1 minute to form a film of the polysiloxane-containing coating composition. The thicknesses of the films of the polysiloxane-containing coating compositions were 180 nm. The stepped substrate was formed from $SiO_2$ and had a hole pattern with a height of 300 nm and a minimum width of 20 nm. Subsequently, the shape of cross section of each of the films of the polysiloxane-containing coating compositions was observed by a cross-sectional SEM, and the coating performance was evaluated. For a polysiloxane-containing coating composition that generates no void and exhibits good coating properties, the coating properties are good. For a polysiloxane-containing coating composition that generates a void, the coating properties are poor.

TABLE 6

| Example 1 | Good |
| Example 2 | Good |
| Example 3 | Good |
| Example 4 | Good |
| Example 5 | Good |
| Example 6 | Good |
| Example 7 | Good |
| Example 8 | Good |
| Example 9 | Good |
| Example 10 | Good |
| Example 11 | Good |
| Example 12 | Good |

TABLE 7

| Example 13 | Good |
| Example 14 | Good |
| Example 15 | Good |
| Example 16 | Good |
| Example 17 | Good |
| Example 18 | Good |
| Example 19 | Good |
| Example 20 | Good |
| Example 21 | Good |

TABLE 7-continued

| Example 22 | Good |
| Example 23 | Good |
| Example 24 | Good |
| Example 25 | Good |
| Example 26 | Good |
| Example 27 | Good |
| Example 28 | Good |
| Example 29 | Good |
| Example 30 | Good |
| Comparative Example 1 | Poor |
| Comparative Example 2 | Poor |

INDUSTRIAL APPLICABILITY

The present invention can provide a coating composition for pattern inversion that fills a gap in a pattern of an organic underlayer film obtained by transferring a resist pattern formed on a substrate to be processed to the underlayer and forms a flat film.

DESCRIPTION OF THE REFERENCE NUMERALS

In FIG. 1, a semiconductor substrate 1 is a wafer, and a semiconductor substrate 2 is, for example, an oxide film or a metal layer that is provided on the semiconductor substrate 1.

In FIG. 1, steps (1) to (3) are steps of forming an organic underlayer film on the semiconductor substrates, applying a silicon hard mask-forming composition to the organic underlayer film and baking the composition to form a silicon hard mask layer, and applying a resist composition to the silicon hard mask layer to form a resist layer. Step (4) is a step of exposing the resist film, and then developing the resist to obtain a resist pattern. Steps (5) to (6) are steps of etching the silicon hard mask through the resist pattern and etching the organic underlayer film through the patterned silicon hard mask layer to form a patterned organic underlayer film. Step (7) is a step of applying the polysiloxane-containing coating composition to the patterned organic underlayer film and exposing a surface of the organic underlayer film by an etch back process. Step (8) is a step of etching the organic underlayer film to obtain an inverted pattern. Step (9) is a step of etching the substrate through the polysiloxane film having the inverted pattern.

The invention claimed is:
1. A coating composition coating an organic underlayer film pattern formed by transferring a resist pattern to an underlayer, the coating composition comprising a polysiloxane obtained by a reaction of an alcohol with a silanol group in a hydrolysis-condensate of a hydrolysable silane having a hydrolysable silane containing in the molecule four hydrolysable groups, in a ratio of 50% by mole to 100% by mole relative to the total amount of silanes; wherein in the polysiloxane to be obtained, a ratio of the silanol group to the silanol group reacted with the alcohol ((silanol group):(silanol group reacted with the alcohol)) is 100:1 to 1:100, wherein the hydrolysable silane is represented by Formula (1):

$$R^1{}_a Si(R^2)_{4-a} \qquad \text{Formula (1)}$$

wherein $R^1$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, or a cyano group and bonded to a silicon atom through a Si—C bond, $R^2$ is an alkoxy group, an acyloxy group, or a halogen atom, and a is an integer of 0 to 3; and contains 50% by mole to less than 100% by mole of a hydrolysable silane in which a is 0 and more than 0% by mole to 50% by mole of a hydrolysable silane in which a is 1 or 2, wherein the polysiloxane is formed from only hydrolysable silanes represented by Formula (1), and wherein the coating composition is used for coating a patterned organic underlayer film, the patterned organic underlayer film is formed by etching a silicon hard mask layer through a resist pattern and etching an organic underlayer film through the patterned silicon hard mask layer.

2. The coating composition according to claim 1, wherein the hydrolysable silane of Formula (1) contains any of tetraalkoxysilane in which a in Formula (1) is 0, methyltrialkoxysilane in which a in Formula (1) is 1, vinyltrialkoxysilane, phenyltrialkoxysilane, or dimethyldialkoxysilane in which a in Formula (1) is 2.

3. The coating composition according to claim 1, wherein the alcohol is an alkoxy group-containing alcohol.

4. The coating composition according to claim 1, wherein the alcohol is propylene glycol monomethyl ether, propylene glycol monoethyl ether, or 3-methoxybutanol.

5. The coating composition according to claim 1, wherein the hydrolysis-condensate of the hydrolysable silane is obtained by using an acid or base as a catalyst.

6. The coating composition according to claim 1, comprising an acid and one or more selected from the group consisting of curing catalysts.

7. A method for producing a semiconductor device comprising steps of:
(1) forming an organic underlayer film on a semiconductor substrate;
(2) applying a silicon hard mask-forming composition to the organic underlayer film and baking the silicon hard mask-forming composition to form a silicon hard mask layer;
(3) applying a resist composition to the silicon hard mask layer to form a resist layer;
(4) exposing the resist film, and then developing the resist to obtain a resist pattern;
(5) etching the silicon hard mask layer through the resist pattern;
(6) etching the organic underlayer film through the patterned silicon hard mask layer to form a patterned organic underlayer film;
(7) applying the coating composition according to claim 1 to the patterned organic underlayer film and curing the coating composition to form a polysiloxane film filling a gap in the pattern;
(8) etching the organic underlayer film to obtain an inverted pattern; and
(9) etching the substrate through the polysiloxane film having the inverted pattern.

8. The coating composition according to claim 1, wherein $R^2$ is a halogen atom.

9. The coating composition according to claim 1, wherein the hydrolysable silane contains 50% by mole to less than 100% by mole of a hydrolysable silane in which a is 0 and more than 0% by mole to 50% by mole of a hydrolysable silane in which a is 1.

10. The coating composition according to claim 1, wherein the hydrolysable silane contains 60% by mole to less than 100% by mole of a hydrolysable silane in which a is 0 and more than 0% by mole to 40% by mole of a hydrolysable silane in which a is 1 or 2.

11. The coating composition according to claim 1, wherein the hydrolysable silane contains 60% by mole to less than 100% by mole of a hydrolysable silane in which a is 0 and more than 0% by mole to 40% by mole of a hydrolysable silane in which a is 1.

* * * * *